United States Patent
Ozaki et al.

(10) Patent No.: US 6,667,240 B2
(45) Date of Patent: Dec. 23, 2003

(54) METHOD AND APPARATUS FOR FORMING DEPOSITED FILM

(75) Inventors: Hiroyuki Ozaki, Kyoto (JP); Masahiro Kanai, Tokyo (JP); Naoto Okada, Nara-ken (JP); Koichiro Moriyama, Kyoto (JP); Hiroshi Shimoda, Nara-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 134 days.

(21) Appl. No.: 09/800,724

(22) Filed: Mar. 8, 2001

(65) Prior Publication Data

US 2002/0015802 A1 Feb. 7, 2002

(30) Foreign Application Priority Data

Mar. 9, 2000 (JP) .................................... 2000-064301

(51) Int. Cl.$^7$ ............................................ H01L 21/311

(52) U.S. Cl. ................. 438/694; 438/784; 438/509; 438/96; 438/484; 257/458; 257/53; 257/55; 257/461; 257/464

(58) Field of Search ......................... 257/458, 53, 55, 257/461, 464; 438/694, 484, 509, 96

(56) References Cited

U.S. PATENT DOCUMENTS

| 4,400,409 A | 8/1983 | Izu et al. ...................... 427/39 |
| 4,504,518 A | 3/1985 | Ovshinsky et al. ............ 427/38 |
| 4,517,223 A | 5/1985 | Ovshinsky et al. ............ 427/39 |
| 5,720,826 A | 2/1998 | Hayashi et al. .............. 136/429 |
| 6,025,039 A | 2/2000 | Yajima ......................... 427/573 |
| 6,096,389 A * | 8/2000 | Kanai ........................... 427/575 |
| 6,350,489 B1 | 2/2002 | Moriyama et al. ........ 427/255.5 |

* cited by examiner

Primary Examiner—Nathan J. Flynn
Assistant Examiner—Fazli Erdem
(74) Attorney, Agent, or Firm—Fitzpatrick, Cella, Harper & Scinto

(57) ABSTRACT

A method for forming a deposited film, comprising generating plasma in a plurality of successive vacuum containers and continuously forming a deposited film on a belt-like substrate while continuously moving the substrate in its longitudinal direction, wherein an opening of a discharge container is adjusted with an opening adjusting plate having a shape set so as to reduce ununiformity of a deposited film thickness in a width direction of the substrate on the basis of a measurement of a deposition rate distribution. Accordingly, there is provided a method and an apparatus for forming a deposited film which are capable of producing a photovoltaic element without ununiformity in characteristics by depositing semiconductor layers without ununiformity in thickness and quality.

16 Claims, 11 Drawing Sheets

METHOD AND APPARATUS FOR FORMING DEPOSITED FILM

BACKGROUND OF THE INVENTION

1. Field of the Invention

The present invention relates to a deposited film forming method and a deposited film forming apparatus for continuously forming a deposited film on an elongated substrate by a plasma CVD method.

2. Related Background Art

As a deposited film forming apparatus for continuously forming a deposited film on a surface of a belt-like substrate, there is conventionally known a deposited film forming apparatus using a continuous plasma CVD method which adopts, for example, a roll-to-roll system disclosed by U.S. Pat. No. 4,400,409.

This apparatus is conceived to be capable of continuously forming an element which has a large area and a semiconductor junction by disposing a plurality of glow discharge regions, arranging the glow discharge regions along a path through which a sufficiently long belt-like substrate having a desired width passes, and continuously conveying the above-described substrate in a longitudinal direction while depositing and forming a semiconductor layer with a required conductivity in the glow discharge regions. The roll-to-roll system can therefore be said as a method which is suited for mass production of semiconductor elements having large areas.

In the conventional CVD method, radio frequency (RF) discharge is widely used as glow discharge plasma exciting means for forming a deposited film by decomposing a raw material gas. On the other hand, attentions have recently been paid to a plasma process which uses a microwave.

The microwave which has a frequency higher than that of RF used in the conventional case is capable of enhancing an energy density and is suited for efficient generation and maintenance of plasma.

For example, U.S. Pat. Nos. 4,517,223 and 4,504,518 disclose methods for depositing and forming a thin film on a substrate having a small area in microwave glow discharge plasma at a low pressure, and it is conceived that the microwave is capable of causing discharge at a lower pressure in comparison with RF and prevents polymerization of active species which constitute a cause for degradation of film characteristics, thereby making it possible not only to obtain a deposited film of high quality but also to suppress production of powders such as polysilane in plasma and remarkably enhance a deposition rate.

For mass production of semiconductor junction elements, for example, solar cells, it is necessary and indispensable to enlarge the deposition region by the deposited film forming apparatus by using the continuous plasma CVD method employing the roll-to-roll system.

Deposited films manufactured by apparatuses using the conventional microwave CVD method and RF plasma CVD method have larger ununiformity in a width direction as the deposition rate and the discharge region become larger.

Furthermore, the deposition rate is remarkably changed dependently on a kind of a discharge energy for generating plasma, discharge conditions (for example, discharging electric power and discharging frequency), a flow rate, a flow velocity, a pressure of a raw material gas in a vacuum container and the like, but changes in raw material gas concentration distribution and plasma density distribution are not taken into consideration, thereby posing a problem that a deposited film which has a uniform thickness and uniform quality cannot be formed in a large deposition region.

For example, in the case of pursuing a deposited film having characteristics for a solar cell by the microwave plasma CVD method, it is necessary to lower microwave electric power and enhance an RF bias introduction electric power. However, a deposited film obtained in such conditions has a thickness distribution which is changed depending on a distance from a microwave introduction position, that is, the deposited film is thinned as its portion is farther from the microwave introduction position.

When the plasma CVD method is applied to a deposited film having a large area, it is difficult to obtain a deposited film which has an uniform thickness and an uniform quality over a large area.

As describe above, the apparatus for continuously forming a semiconductor deposited film by the conventional roll-to-roll system poses a problem that the characteristics of a photovoltaic element are liable to be ununiform in a width direction of a substrate when a deposited film is formed by the microwave plasma CVD method which is capable of forming a film at a high speed.

SUMMARY OF THE INVENTION

In view of the above-described problem, an object of the present invention is to provide a deposited film forming method and a deposited film forming apparatus which are capable of forming a photovoltaic element having no ununiform characteristics by depositing semiconductor layers without ununiform thickness and ununiform properties.

In order to accomplish the above-described object, a deposited film forming method according to the present invention is a deposited film forming method for generating plasma in a plurality of successive vacuum containers and continuously forming a deposited film on a belt-like substrate while continuously moving the belt-like substrate in its longitudinal direction, wherein an opening of a discharge container is adjusted with opening adjusting plates having shapes set so as to reduce thickness ununiformity in a width direction of the substrate on the basis of a measurement of a deposition rate distribution.

For the above-described deposited film forming method, when a distance of a discharge space in a conveying direction is represented by $x_n$, a distance of the discharge space in a direction perpendicular to the conveying direction is represented by $y_n$, a deposition rate at an optional point $(x_n, y_n)$ in the discharge space is represented by $d(x_n, y_n)$, a deposited film thickness at $y=y_n$, $X_{Pn} \leq x_n \leq x_{Qn}$ in the discharge space is represented by $\delta_n(x, y_n)$, wherein n=3, 4, 5, 6, . . . , and when a substrate conveying rate is represented by v and an ideal thickness of the deposited film is designated by $\delta$, $$d_n(x, y_n) = d_n(vt, y_n) = a_n t^2 + b_n t + c_n (\because x = vt)$$

(Which is an approximate expression of the deposition rate)

$$\delta_n(vt, y_n) = \int_{Pn}^{Qn} d_n(vt, y_n) dt = \delta \quad (1)$$

Then, a point $A_n (vP_n, y_n)$ and a point $B_n (vQ_n, y_n)$ which satisfy the formula (1) are obtained.

A quadratic curve passing the point $A_n$:

$$x=F_1(y) \quad (2)$$

A quadratic curve passing the point Bn:

$$x=F_2(y) \quad (3)$$

It is preferable to set both ends of the opening of the discharge container so as to have a curve satisfying the formula (2) and a curve satisfying the formula (3) and limit the deposition region of the belt-like substrate by adjusting the opening of the discharge container. In the present invention, the both ends of the opening mean two portions defining end portions of the opening in the width direction of the substrate.

Furthermore, it is preferable to set a shape of the above-described opening adjusting plate so that the both ends of the opening of the discharge container have an arc passing the above-described point $A_n$ and an arc passing the above-described point $B_n$ which are determined from a deposition rate distribution in the width direction of the belt-like substrate and limit the deposition region of the belt-like substrate by adjusting the opening of the discharge container with the opening adjusting plate.

Furthermore, it is preferable to set the shape of the above-described opening adjusting plate within ±10% of a shape of an opening determined from the deposition rate distribution in the width direction of the belt-like substrate.

Furthermore, it is preferable that the above-described deposited film is formed by the microwave plasma CVD method.

Furthermore, it is preferable to set the shape of the opening adjusting plate so that ununiformity of a film thickness distribution of the deposited film is within 10% in the width direction of the belt-like substrate.

Furthermore, it is preferable to adopt the roll-to-roll system in which a belt-like substrate from a roll-like wound substrate are continuously moved through a plurality of discharge containers.

On the other hand, a deposited film forming apparatus according to the present invention is a deposited film forming apparatus for generating plasma in a plurality of successive vacuum containers and continuously forming a deposited film on a belt-like substrate while continuously moving the above-described belt-like substrate in its longitudinal direction, wherein opening adjusting plates having shapes set so as to reduce ununiformity of a film thickness of the deposited film in the width direction of the substrate on the basis of a measurement of a deposition rate distribution are disposed in an opening of discharge container.

For the above-described deposited film forming apparatus according to the present invention, when a distance of a discharge space in a conveying direction is represented by $x_n$, a distance of the discharge space in a direction perpendicular to the conveying direction is designated by $y_n$, a deposition rate at an optional point $(x_n, y_n)$ in the discharge space is denoted by $d(x_n, y_n)$, a deposited film thickness at $y=y_n$, $x_{pn} \leq x_n \leq x_{Qn}$ in the discharge space is represented by $\delta n(x, y_n)$, wherein n=3, 4, 5, 6, and when a substrate conveying rate is represented by v and an ideal deposited film thickness is designated by $\delta$, $$d_n(x, y_n)=d_n(vt, y_n)=a_n t^2+b_n t+c_n (\because x=vt)$$

$$\delta_n(vt, y_n) = \int_{P_n}^{Q_n} d_n(vt, y_n) dt = \delta \quad (1)$$

Then, a point $A_n$ $(vP_n, y_n)$ and a point $B_n$ $(vQ_n, y_n)$ which satisfy the formula (1) are obtained.

A quadratic curve passing the point $A_n$:

$$x=F_1(y) \quad (2)$$

A quadratic curve passing the point $B_n$:

$$x=F_2(y) \quad (3)$$

It is preferable to set both ends of the opening of the discharge container so as to have a curve satisfying the formula (2) and a curve satisfying the formula (3), respectively, and dispose an opening adjusting plate in the opening of the discharge container to limit the deposition region of the belt-like substrate.

Furthermore, it is preferable to set a shape of the above-described opening adjusting plate so that both the ends of the opening of the discharge container have an arc passing the above-described point $A_n$ and an arc passing the above-described point $B_n$ which are determined from a deposition rate distribution in the width direction of the belt-like substrate, and dispose an opening adjusting plate in the opening of the discharge container to limit the deposition region of the belt-like substrate.

Furthermore, it is preferable to set the shape of the above-described opening adjusting plate so as to be within ±10% of a shape of an opening adjusting plate determined from the deposition rate distribution in the width direction of the belt-like substrate.

Furthermore, it is preferable that the above-described deposited film is formed by a microwave plasma CVD apparatus.

Furthermore, it is preferable to dispose an opening adjusting plate having such a shape as to limit ununiformity in a film thickness distribution of the above-described deposited film within 10% in the width direction of the belt-like substrate.

Furthermore, it is preferable to configure the deposited film forming apparatus of a roll to roll system type apparatus in which a belt-like substrate from a roll-like wound substrate is continuously moved through a plurality of discharge containers.

The deposited film forming method which uses the plasma CVD method generates a film thickness distribution of a deposited film when a discharge space is expanded so as to enlarge a film forming region. The distribution is largely changed depending on a microwave introducing method and conditions for forming the deposited film. A deposition rate distribution is largely different, for example, between a case where a microwave electric power is introduced in one direction and a case where the microwave electric power is introduced in two directions.

According to the present invention, a deposition rate distribution is measured and a shape of the opening adjusting plate is determined so as to make uniform a deposited film thickness in the width direction of the substrate. By disposing the opening adjusting plate in the opening of the discharge container, it is possible to shield the substrate from the discharge region and limit a deposition region on the belt-like substrate. This method makes it possible to form a deposited film which has a uniform thickness over a large area.

Even when film forming conditions are modified, in order to optimize deposited film forming conditions, a shape of the opening adjusting plate is determined once again to be able to form a deposited film having a uniform thickness.

Furthermore, the present invention provides a film forming method for generating plasma in a plurality of successive vacuum containers and continuously forming a deposited film on a belt-like substrate while continuously moving the above-described substrate in its longitudinal direction, wherein both ends of the opening of the discharge container are set so as to have a curve satisfying the following formula (4) and a curve satisfying the following formula (5), respectively, to adjust the opening of the discharge container, thereby limiting a deposition region of the belt-like structure, and wherein when a distance of a discharge space in a conveying direction is represented by $x_n$, a distance of the discharge space in a direction perpendicular to the conveying direction is represented by $y_n$, a deposition rate at an optional point $(x_n, y_n)$ in the discharge space is represented by $d(x_n, y_n)$, a deposited film thickness at $y=y_n$, $x_{Pn} \leq x_n \leq x_{Qn}$ in the discharge space is represented by $\delta_n(x, y_n)$, and n=3, 4, 5, 6, . . . , and when a substrate conveying rate is represented by v and an ideal thickness of the deposited film is represented by, $$d_n(x, y_n) = d_n(vt, y_n) = a_n t^2 + b_n t + c_n (\because x=vt)$$

$$\delta_n(vt, y_n) = \int_{P_n}^{Q_n} d_n(vt, y_n) dt = \delta \quad (1)$$

a point $A_n$ $(vP_n, y_n)$ and a point $B_n$ $(vQ_n, y_n)$ which satisfy the formula (1) are obtained, and a quadratic curve passing the point $A_n$ is $x=F_1(y)$ . . . (2), and a quadratic curve passing the point $B_n$ is $x=F_2(y)$ . . . (3), and on the basis of formulas (2) and (3), the following inequality formulas are obtained, respectively:

$$1.1F_1(y) - 0.1F_2(y) \leq x \leq 0.9F_1(y) + 0.1F_2(y) \quad (4)$$

$$0.9F_2(y) + 0.1F_1(y) \leq x \leq 1.1F_2(y) - 0.1F_1(y) \quad (5)$$

Furthermore, the present invention provides a deposited film forming apparatus for generating plasma in a plurality of successive vacuum containers and continuously forming a deposited film on a belt-like substrate while continuously moving the above-described substrate in a longitudinal direction, wherein both ends of the opening of the discharge container are set so as to have a curve satisfying the following formula (4) and a curve satisfying the following formula (5), respectively, to adjust the opening of the discharge container, thereby limiting a deposition region of the belt-like structure, and wherein when a distance of a discharge space in a conveying direction is represented by $x_n$, a distance of the discharge space in a direction perpendicular to the conveying direction is represented by $y_n$, a deposition rate at an optional point $(x_n, y_n)$ in the discharge space is represented by $d(x_n, y_n)$, a deposited film thickness at $y=y_n$, $x_{Pn} \leq x_n \leq x_{Qn}$ in the discharge space is represented by $\delta_n(x, y_n)$, and n=3, 4, 5, 6, . . . , and when a substrate conveying rate is represented by v and an ideal thickness of the deposited film is represented by, $$d_n(x, y_n) = d_n(vt, y_n) = a_n t^2 + b_n t + c_n (\because x=vt)$$

$$\delta_n(vt, y_n) = \int_{P_n}^{Q_n} d_n(vt, y_n) dt = \delta \quad (1)$$

a point $A_n$ $(vP_n, y_n)$ and a point $B_n$ $(vQ_n, y_n)$ which satisfy the formula (1) are obtained, and a quadratic curve passing the point $A_n$ is $x=F_1(y)$ . . . (2), and a quadratic curve passing the point $B_n$ is $x=F_2(y)$ . . . (3), and on the basis of the formulas (2) and (3), the following inequality formulas (4) and (5) are obtained, respectively:

$$1.1F_1(y) - 0.1F_2(y) \leq x \leq 0.9F_1(y) + 0.1F_2(y) \quad (4)$$

$$0.9F_2(y) + 0.1F_1(y) \leq x \leq 1.1F_2(y) - 0.1F_1(y) \quad (5)$$

DETAILED DESCRIPTION OF THE PREFERRED EMBODIMENTS

Referring now to the accompanying drawings, description will be made of preferable embodiments of the present invention which do not limit the present invention.

The deposited film forming apparatus according to the present invention is an apparatus for forming a functional deposited film on a surface of a belt-like substrate while continuously conveying the substrate in a longitudinal direction, wherein the belt-like substrate is shielded from a discharge region with an opening adjusting plate provided in an opening of a discharge container, thereby limiting a region for deposition on the substrate.

The deposited film forming apparatus according to the present invention therefore solves a serious problem of the conventional deposited film forming method using the plasm CVD method, thereby making it possible to form a deposited film having a large area, by expanding a discharge space and simultaneously make uniform a thickness and a property of a film deposited on the belt-like substrate.

A deposited film forming apparatus used in the present invention will be described with reference to the accompanying drawings. The apparatus used in the present invention is a conventional roll-to-roll type successive plasma CVD apparatus shown in FIG. 2.

Figure 2:
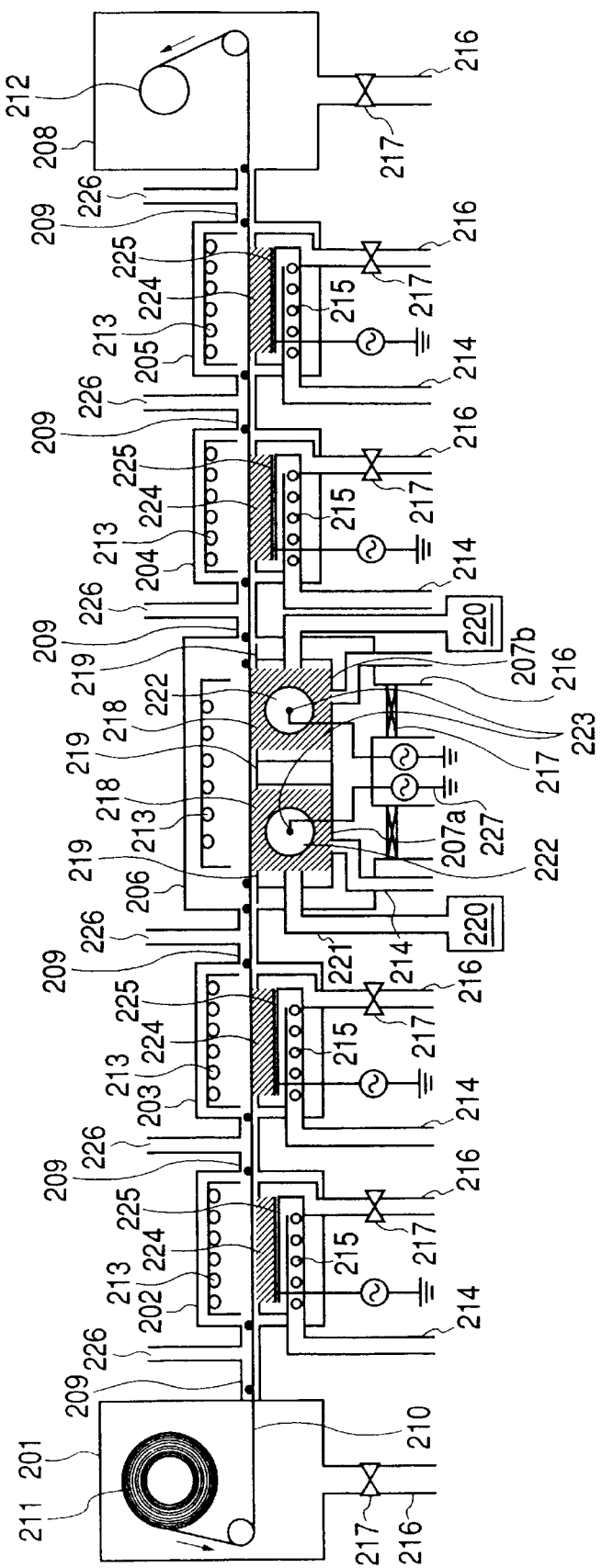
FIG. 2 is a schematic diagram showing a roll to roll type plasma CVD apparatus which is used for manufacturing a single cell in the example of the present invention.

In FIG. 2, the deposited film forming apparatus is configured basically by a belt-like substrate delivery chamber 201, an n type semiconductor layer vacuum container 202 using a radio frequency plasma CVD method, an i type semiconductor layer vacuum container 203, an i type semiconductor layer vacuum container 204, a p type semiconductor layer vacuum container 205, an i type semiconductor layer vacuum container 206 using a microwave plasma CVD method which contains two discharge containers 207a and 207b, and a belt-like substrate takeup chamber 208, the vacuum containers 202 through 206 being connected by a gas gate 209.

In the apparatus according to the present invention, a belt-like substrate 210 is delivered from a bobbin 211 in the delivery chamber 201, and moved while passing through the five vacuum containers 202 through 206 which are connected by gas gates 209 until the belt-like substrate 210 is taken up by a bobbin 212 in the takeup chamber 208. During this period, a deposited film of a semiconductor having a nip structure is formed on a surface of the substrate.

Attached to each of the vacuum containers 202 through 206 are a heater 213 for heating the substrate, a gas introducing pipe 214 which introduces a film forming gas from gas supply means (not shown) into the discharge container, a gas heater 215 which heats the introduced gas, and an exhaust pipe 216 which evacuates a discharge container by exhausting means (not shown). In addition, the exhaust pipes 216 and exhaust adjusting valves 217 are attached also to the delivery chamber 201 and the takeup chamber 208.

Disposed in discharge regions 218 of the vacuum container 206 which uses the microwave CVD method, are opening adjusting plates 219 which are arranged in openings of discharge containers 207a and 207b to control a deposited film thickness distribution of the belt-like substrate, applicators 222 which supply a microwave electric power for causing discharge by imparting an energy to the film forming gas in the discharge containers from microwave oscillators 220 through waveguides 221, and bias bars 223 which apply RF electric power from RF oscillators 227 to plasma so that a deposited film is formed by decomposing the supplied raw material gases.

Disposed at discharge regions 224 of the vacuum containers 202 through 205 which use the RF plasma CVD method are cathodes 225 which apply the RF electric power to the raw material gas to form a deposited film by the RF plasma CVD method.

The gas gates 209 are disposed so that the vacuum containers are separated and independent, and the belt-like substrate 210 passes through the discharge regions and are continuously conveyed. High quality deposited films which have different compositions and composed of multiple layers can be formed by introducing gate gases from gate gas introducing pipes 226 and preventing the raw material gases in the adjacent vacuum containers from being mixed with each other.

The deposited film forming method according to the present invention is carried out using the deposited film forming apparatus which has the above-described configuration. In other words, the deposited film forming method according to the present invention is a deposited film forming method in which plasma is generated in a plurality of successive vacuum containers and a deposited film is continuously formed on a belt-like substrate while continuously moving the above-described substrate in its longitudinal direction, wherein the opening of the discharge container is adjusted with the opening adjusting plates having shapes set so as to reduce ununiformity in thickness of the deposited film in a width direction of the substrate on the basis of a measurement of a deposition rate distribution.

Specifically, when a distance of a discharge space in the conveying direction is represented by $X_n$, a distance of the discharge space in a direction perpendicular to the conveying direction is designated by $y_n$, a deposition rate at an optional point $(x_n, y_n)$ in the discharge space is denoted by $d(x_n, y_n)$, a deposited film thickness at $y=y_n$, $x_{Pn} \leq x_n \leq x_{Qn}$ in the discharge space is represented by $\delta_n(x, y_n)$ wherein n=3, 4, 5, 6, . . . , and when a substrate conveying rate is represented by v and an ideal deposited film thickness is designated by $\delta$, $$d_n(x, y_n) = d_n(vt, y_n) = a_n t^2 + b_n t + c_n (\because x=vt)$$

$$\delta_n(vt, y_n) = \int_{Pn}^{Qn} d_n(vt, y_n) dt = \delta \quad (1)$$

are obtained, and a point $A_n$ $(vP_n, y_n)$ and a point $B_n$ $(vQ_n, y_n)$ which satisfy the formula (1) are obtained.

A quadratic curve passing the point $A_n$: $x=F_1(y)$ . . . (2)
A quadratic curve passing the point $B_n$: $x=F_2(y)$ . . . (3)

Both ends of the opening of the discharge container are set so as to have a curve satisfying the formula (2) and a curve satisfying the formula (3), and a deposition region of the belt-like substrate is limited by adjusting the opening of the discharge container.

Furthermore, a shape of the opening adjusting plate is set so that the both ends of the opening of the discharge container have an arc passing the above-described point $A_n$ and an arc passing the above-described point $B_n$ which are determined from a deposition rate distribution in the width direction of the belt-like substrate, and the deposition region of the belt-like substrate is limited by adjusting the opening of the discharge container with the opening adjusting plate.

Furthermore, it is preferable that the shape of the opening adjusting plate is set so as to be within 10% of an opening shape determined from the deposition rate distribution in the width direction of the belt-like substrate.

It is preferable to form the deposited film by the plasma CVD method, in particular, the microwave plasma CVD method.

Furthermore, it is preferable to set the shape of the opening adjusting plate so that film thickness ununiformity of the deposited film in the width direction of the belt-like substrate is within 10%.

For continuously forming the deposited film, it is preferable to adopt the roll to toll system capable of continuously moving a belt-like substrate from a roll-like wound substrate through a plurality of discharge containers.

That is, in the present invention, a deposition rate distribution is measured to determine the shape of the opening adjusting plate so as to make uniform a deposited film thickness in the width direction of the substrate. By disposing the opening adjusting plate in the opening of the discharge container, it is possible to shield the substrate from the discharge region and limit a deposition region on the belt-like substrate. This method makes it possible to form a deposited film having an uniform thickness over a large area.

Even when film forming conditions are modified, in order to optimalize conditions for forming the deposited film, a shape of the opening adjusting plate is determined once again, whereby the present invention makes it possible to form a deposited film having an uniform thickness.

When a deposited film is formed over an entire range of the opening of the discharge container without disposing the opening adjusting plate for controlling a deposited film thickness distribution in the opening of the discharge container nor limiting a deposition region, a film deposition rate is widely distributed. This is because a deposition rate tends to be smaller at a location farther from a microwave electric power introducing position, and deposition rates are characteristically distributed depending on microwave electric power introduction methods of deposited film forming apparatuses.

Figure 1:
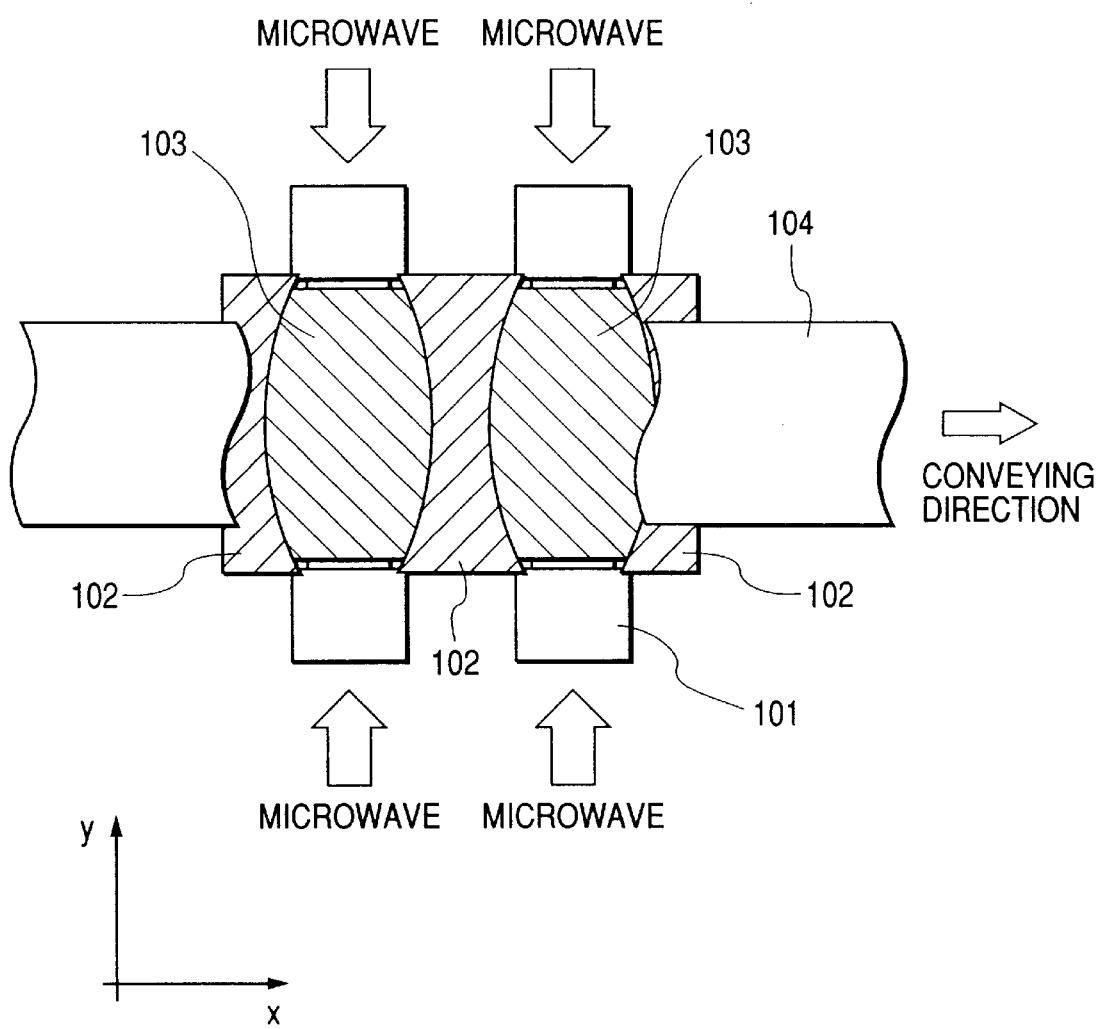
FIG. 1 is a conceptional diagram explaining Example 1 of the present invention in which an opening adjusting plate is disposed in an opening of a discharge container so as to make uniform a film thickness distribution in width direction of a belt-like substrate.

For example, when microwave electric power is introduced using four applicators 101 as shown in FIG. 1, deposition rates are distributed at a central position smaller than at both ends. By disposing opening adjusting plates 102 which have shapes shown in FIG. 1 and are matched with such a deposition rate distribution, it is possible to form openings 103 matched with a film thickness distribution in the opening of the discharge container, thereby obtaining a deposited film having an uniform thickness and an uniform quality on a belt-like substrate 104.

Even when film forming conditions are modified to improve the characteristics of the film, it is possible to form a deposited film having an uniform thickness by modifying the shapes of the opening adjusting plates.

Description will be made below of concrete examples of the deposited film forming method and the deposited film forming apparatus according to the present invention, which do not limit the present invention in any way.

EXAMPLE 1

Using a deposited film forming apparatus shown in FIG. 2, the deposited film forming method according to the present invention will be described in a due sequence. In this experiment, a deposition rate distribution of a deposited film having i type layers which was manufactured by the microwave CVD method was checked. The deposited film forming apparatus shown in FIG. 2 introduces microwave electric power using the four applicators 222. Manufacturing conditions are shown in Table 1.

TABLE 1

| Substrate | SUS430 (Width 350 mm × Length 300 m × Thickness 0.2 mm) | | | |
|---|---|---|---|---|
| Gate gas | $H_2$: 1000 (sccm) | | | |
| Name of layer | Used gas and flow rate (sccm) | Pressure (Pa) | Effective electric power (W) | Heating temperature (° C.) |
| Manufacturing condition for each layer | | | | |
| n type layer | $SiH_4$:220 $PH_3/H_2$ ($PH_3$: 2%): 330 $H_2$: 3000 | 133.3 (1.0 Torr) | RF electric power: 250 | 250 |
| i type buffer layer | $SiH_4$:170 $H_2$:1500 | 134.0 (1.05 Torr) | RF electric power: 180 | 270 |

TABLE 1-continued

| i type layer | $SiH_4$:120 × 2 $GeH_4$: 100 × 2 $H_2$: 600 × 2 | 1.3 (0.01 Torr) | Microwave electric power: 200 RF bias electric power: 1800 | 350 |
|---|---|---|---|---|
| i type buffer layer | $SiH_4$: 170 $H_2$: 1500 | 134.0 | RF electric (1.05 Torr) | 320 power: 210 |
| p type layer | $SiH_4$: 30 $BF_3H_2$ ($BF_3$: 2%): 380 $H_2$: 5000 | 133.3 (1.0 Torr) | RF electric power: 800 | 175 |
| Transparent electrode | ITO ($In_2O_3$ + $SnO_2$) thin film 70 nm | | | |
| Collector electrode | Alumimium (Al) thin film 2 $\mu$m | | | |

A bobbin 211 around which sufficiently degreased and cleaned stainless steel belt-like substrate (SUS 430, 350 mm wide×300 m long×0.2 mm thick) was wound was set in a vacuum container 201 having a substrate feeding mechanism. The belt-like substrate was passed to a takeup chamber 208 for the belt-like substrate consecutively through gas gates 209, an n type semiconductor layer vacuum container 202, an i type semiconductor layer vacuum container 203, an i type semiconductor layer vacuum chamber 206, an i type semiconductor layer vacuum container 204 and a p type semiconductor layer vacuum container 205, and tension was adjusted to a degree at which the substrate is free from slack. A pressure in each of the vacuum containers was reduced to $1.3 \times 10^{-4}$ Pa ($1 \times 10^{-6}$ Torr) with an evacuating apparatus (not shown).

First, a deposited film was formed over an entire range of the openings of the discharge containers 207a and 207b without disposing the opening adjusting plates 219 for adjusting a deposited film thickness distribution in the openings of the discharge containers 207a and 207b, and a deposition rate distribution was measured.

For heat treatment at a film forming time, 1000 sccm of $H_2$ was introduced into each gas gate 209 from the gate gas introducing pipe 226 as a gate gas and the belt-like substrate 210 was heated to 300° C. with the substrate heater 213.

A raw material gas was introduced into each discharge container from the gas introducing pipe 214. The belt-like substrate was conveyed at a speed of 1270 mm/min, and microwave electric power and RF electric power were applied to the discharge containers from the microwave oscillator 220 and the RF oscillator 227 to cause plasma discharge in the film forming regions, thereby forming an i type amorphous silicon film on the belt-like substrate.

Figure 3:
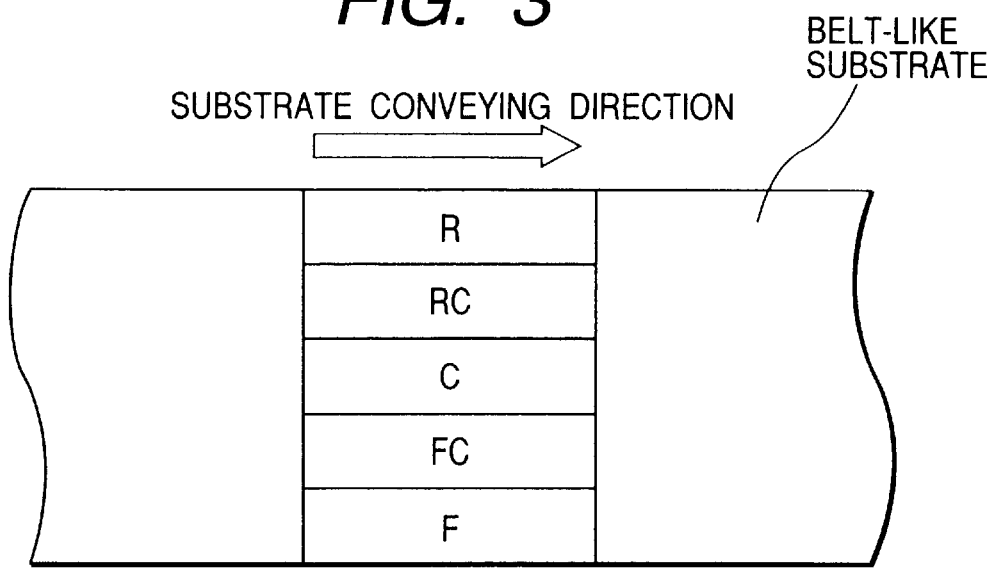
FIG. 3 is a diagram showing a location at which ununiformity in a width direction is evaluated in the example of the present invention.

After confirming stabilization of a discharge condition, conveyance of the belt-like substrate was stopped and a stationary sample was prepared. Deposition rates of an obtained deposited film were measured with a spectroscope. For evaluating a distribution in the width direction, deposition rates were measured at five points in a central portion (C) and both ends (F, FC, RC and R) as shown in FIG. 3 by 10 points in a substrate conveying direction, i.e., at 50 points in total. Measured results are shown in Table 2 and FIG. 4. Points at positions 30 through 110 in Table 2 are located in the discharge container 207a, whereas points at positions 250 through 330 in Table 2 are located in the discharge container 207b.

TABLE 2

| Position | Position (mm) | | | | | | | | | |
|---|---|---|---|---|---|---|---|---|---|---|
|  | 30 | 50 | 70 | 90 | 110 | 250 | 270 | 290 | 310 | 330 |
| F | 71.7 | 86.6 | 89.0 | 81.1 | 70.0 | 70.0 | 81.0 | 89.2 | 86.2 | 72.0 |
| FC | 61.0 | 75.5 | 77.8 | 70.9 | 60.5 | 60.0 | 71.5 | 80.0 | 74.2 | 59.3 |
| C | 54.4 | 65.1 | 67.7 | 64.9 | 52.3 | 53.0 | 65.9 | 69.4 | 64.3 | 52.4 |
| RC | 58.2 | 73.5 | 76.3 | 69.1 | 58.5 | 58.0 | 70.0 | 78.5 | 72.0 | 58.0 |
| R | 71.5 | 85.7 | 89.0 | 80.6 | 68.0 | 68.0 | 80.9 | 88.5 | 86.0 | 69.2 |

Figure 4:
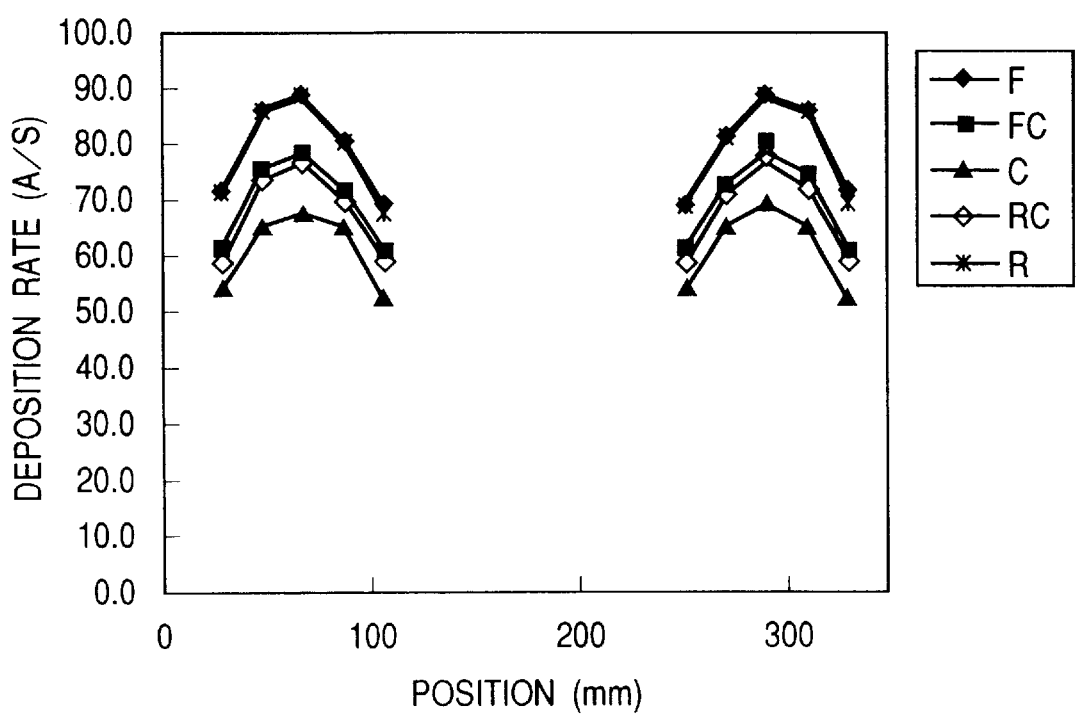
FIG. 4 is a graph showing deposition rates on stationary samples in the example of the present invention.

As seen from Table 2 and FIG. 4, deposition rates of the obtained deposited film were not constant in the substrate width direction and the conveying direction, but a total deposited film thickness exhibited a large distribution in the width direction when the film was deposited while conveying the belt-like substrate 210.

On the basis of a result of the obtained deposition rate distribution, shapes of the opening adjusting plates were determined for each of left and right discharge containers.

First, shapes of the opening adjusting plates were determined for a discharge space A.

When a distance of the discharge space in the conveying direction was represented by x, a distance of the discharge space in a direction perpendicular to the conveying direction was designated by y, a deposition rate at an optional point (x, y) in the discharge space was denoted by d(x, y), a deposited film thickness at $y_1=175$ (mm), $x_{P1} \leq x_1 \leq x_{Q1}$ in the discharge space was represented by $\delta_1$ (x, $y_1$), a substrate conveying rate v was 1270 (mm/min), an ideal deposited film thickness $\delta$ was 300 (Å), $$d_1(x, y_1) = d_1(vt, y_1) = -4.2t^2 + 27t + 24 (\because x = vt)$$

$$\delta_n(vt, y_n) = \int_{Pn}^{Qn} d_n(vt, y_n) dt = \delta \quad (1)$$

(t, $y_1$) satisfying the formula (1) are $A_1$ (0.28, 175) and $B_1$ (632, 175)

∴(x, y)=$A_1$ (6.0, 175), $B_1$ (134, 175)

When a deposited film thickness at $y_2=35$ (mm), $x_{P2} \leq x_2 \leq x_{Q2}$ in the discharge space was denoted by $\delta$ (x, $y_2$), the following was obtained:

$$d_2(x, y_2) = d_2(vt, y_2) = -5.0t^2 + 32t + 37 (\because x = vt)$$

$$\delta_2(vt, y_2) = \int_{P2}^{Q2} d_2(vt, y_2) dt = \delta \quad (1)'$$

(t, $y_2$) satisfying the formula (1)' are $A_2$ (0.85, 35) and $B_2$ (5.75, 35)

∴(x, y)=$A_2$ (18, 35), $B_2$(122, 35)

When a deposited film thickness at $y_3=315$ (mm), $x_{P3} \leq x_3 \leq x_{Q3}$ was denoted by $\delta$ (x, $y_3$), the following was obtained:

$$d_3(x, y_3) = d_3(vt, y_3) = -5.2t^2 + 33t + 35 (\because x = vt)$$

$$\delta_3(vt, y_3) = \int_{P3}^{Q3} d_3(vt, y_3) dt = \delta \quad (1)''$$

(t, $y_3$) satisfying the formula (1)" are $A_3$ (0.78, 315) and $B_3$ (5.82, 315)

∴(x,y)=$A_3$ (17, 315), $B_3$ (123, 315)

A quadratic curve passing the points $A_1$, $A_2$ and $A_3$: x=$F_1$ (y)=$5.9 \times 10^{-4} y^2 - 0.21y + 24$ A quadratic curve passing the points $B_1$, $B_2$ and $B_3$: x=$F_2$ (y)=$-5.9 \times 10^{-4} y^2 + 0.21y + 116$ Similarly, shapes of the opening adjusting plates for a discharge space B were determined.

When a deposited film thickness at $y_1=175$ (mm), $x_{P1} \leq x_1 \leq x_{Q1}$ in the discharge space was denoted by $\delta_1$ (x, $y_1$), a substrate conveying rate v was 1270 (mm/min), an ideal deposited film thickness $\delta$ was 300 (Å), $$d_1(x, y_1) = d_1(vt, y_1) = -4.7t^2 + 31t + 19 (\because x = vt)$$

$$\delta_n(vt, y_n) = \int_{Pn}^{Qn} d_n(vt, y_n) dt = \delta \quad (1)$$

(t, $y_1$) satisfying the formula (1) are $A_1$ (0.29, 175) and $B_1$ (631, 175)

∴(x, y)=$A_1$ (6.1, 175), $B_1$ (133.9, 175)

When a deposited film thickness at $y_2=35$ (mm), $x_{P2} \leq x_2 \leq x_{Q2}$ in the discharge space was denoted by $\delta$ (x, $y_2$), the following was obtained:

$$d_2(x, y_2) = d_2(vt, y_2) = -5.0t^2 + 34t + 31 (\because x = vt)$$

$$\delta_2(vt, y_2) = \int_{P2}^{Q2} d_2(vt, y_2) dt = \delta \quad (1)'$$

(t, $y_2$) satisfying the formula (1)' are $A_2$ (0.83, 35) and $B_2$ (5.77, 35)

∴(x, y)=$A_2$ (17.6, 35), $B_2$ (122.4, 35)

When a deposited film thickness at $y_3=315$ (mm), $x_{P3} \leq x_3 \leq x_{Q3}$ in the discharge space was denoted by $\delta$ (x, $y_3$), the following was obtained:

$$d(x, y_3) = d_3(vt, y_3) = -5.6t^2 + 38t + 25 (\because x = vt)$$

$$\delta_3(vt, y_3) = \int_{P3}^{Q3} d_3(vt, y_3) dt = \delta \quad (1)''$$

(t, $y_3$) satisfying the formula (1)" are $A_3$ (0.77, 315) are $B_3$ (5.83, 315)

∴(x, y)=$A_3$ (16.3, 315), $B_3$ (123.7, 315)

A quadratic curve passing the points $A_1$, $A_2$ and $A_3$: x=$F_1$ (y)=$5.9 \times 10^{-4} y^2 - 0.21y + 24$ A quadratic curve passing the points $B_1$, $B_2$ and $B_3$: x=$F_2$=$-5.9 \times 10^{-4} y^2 + 0.21y + 116$ Using opening adjusting plates 102 having the curved shapes obtained from the above at the opening-side ends, as shown in FIG. 1, an nip type single cell was manufactured by controlling a deposited film thickness distribution on the belt-like substrate 104.

After carrying out steps till gas introduction similarly as in experiment 1, the belt-like substrate was conveyed at a rate of 1270 mm/min, and microwave electric power and RF electric power were applied to the discharge containers from a microwave oscillator 220 and the RF oscillator 227 to cause plasma discharge in the film forming regions, thereby forming the nip type amorphous silicon film on the belt-like substrate.

ITO($In_2O_3$+$SnO_2$) was deposited to a thickness of 70 nm as a transparent electrode on the formed nip type amorphous silicon film by vacuum vapor deposition, and Al was further deposited to a thickness of 2 μm as a collector electrode by vacuum vapor deposition, thereby manufacturing a photovoltaic element. A thickness distribution of an i type layer was evaluated from a C-V characteristic of the obtained photovoltaic element. A thickness distribution of the obtained deposited film is shown in Table 3.

TABLE 3

| Position | F | FC | C | RO | R | Ununiformity |
|---|---|---|---|---|---|---|
| Example 1 | 1.00 | 0.93 | 0.92 | 0.94 | 0.98 | 3.1% |
| Comparative Example 1 | 1.00 | 0.97 | 0.94 | 0.89 | 0.83 | 22.1% |

Example 1 of the present invention indicated that an obtained deposited film thickness was uniform in the width direction and ununiformity of the deposited film thickness was in a range within 10%.

Figure 5:
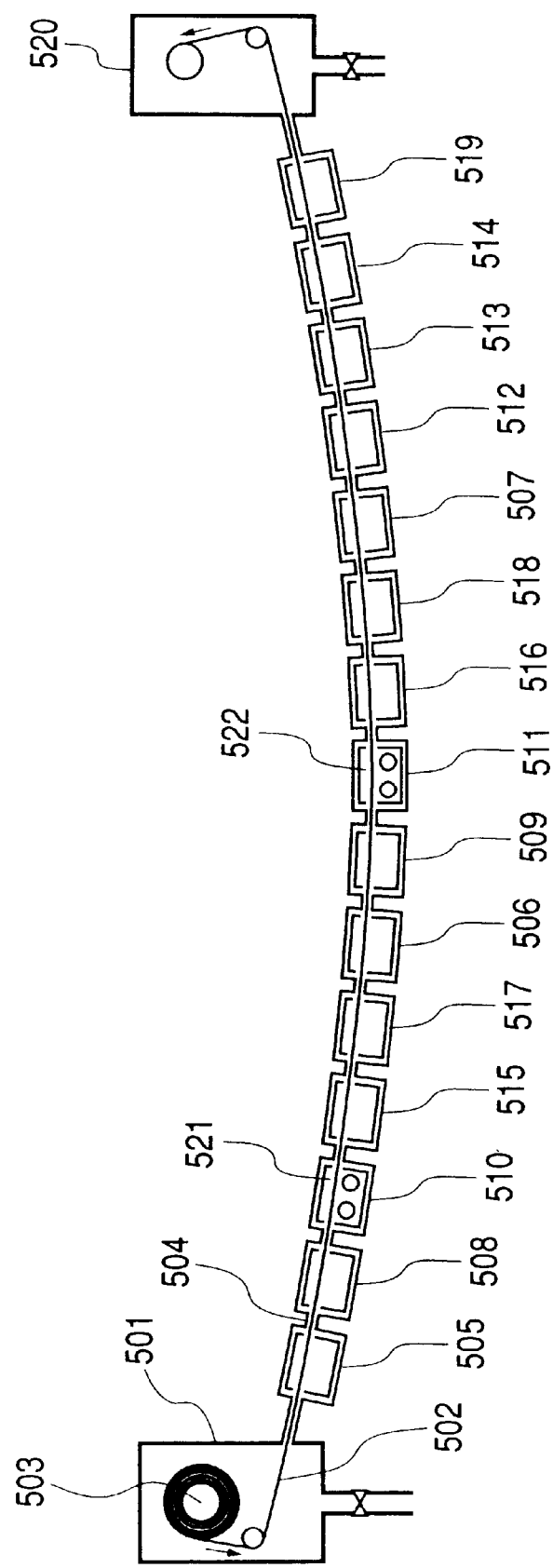
FIG. 5 is a schematic diagram showing a roll to roll type plasma CVD apparatus which is used for manufacturing triple cells in the example of the present invention.

Then, a triple cell was manufactured using a roll to roll type plasma CVD apparatus shown in FIG. 5 which was capable of forming an nipnipnip type triple cell. Film forming conditions are summarized in Table 4.

TABLE 4

| Substrate | SUS430 (Width 350 mm × Length 300 m × Thickness 0.2 mm) | | | |
|---|---|---|---|---|
| Reflecting layer | ALuminmium (Al) thin film: 0.2 μm | | | |
| Reflection enhancing layer | Zinc oxide (ZnO): 1.2 μm | | | |
| Gate gas | $H_2$: 1000 (sccm) | | | |
| Name of layer | Used gas and flow rate (sccm) | Pressure (Pa) | Efective electric power (W) | Heating temperature (° C.) |

| Manufacturing condition for each layer | | | | |
|---|---|---|---|---|
| n type layer | $SiH_4$: 220<br>$PH_3/H_2$<br>($PH_3$: 2%): 330<br>$H_2$: 1500 | 133.3<br>(1.0 Torr) | RF electric power: 250 | 320 |
| i type buffer layer | $SiH_4$: 60<br>$H_2$: 900 | 134.0<br>(1.05 Torr) | RF electric power: 180 | 270 |
| i type layer | $SiH_4$:100 × 2<br>$GeH_4$:<br>120 × 2<br>$H_2$: 600 × 2 | 1.3<br>(0.01 Torr) | Microwave electric power: 200<br>RF electric power: 900 | 380 |
| i type buffer layer | $SiH_4$: 170<br>$H_2$: 1500 | 134.0<br>(1.05 Torr) | RF electric power: 210 | 340 |
| p type layer | $SiH_4$: 30<br>$BF_3H_2$<br>($BF_3$: 2%): 800<br>$H_2$: 3000 | 133.3<br>(1.0 Torr) | RF electric power: 800 | 175 |
| n type layer | $SiH_4$: 220<br>$PH_3/H_2$<br>($PH_3$: 2%): 330<br>$H_2$: 3000 | 133.3<br>(1.0 Torr) | RF electric power: 250 | 250 |

TABLE 4-continued

| i type buffer layer | $SiH_4$: 60<br>$H_2$: 1500 | 134.0<br>(1.05 Torr) | RF electric power: 180 | 270 |
|---|---|---|---|---|
| i type layer | $SiH_4$:120 × 2<br>$GeH_4$:<br>100 × 2<br>$H_2$: 600 × 2 | 1.3<br>(0.01 Torr) | Microwave electric power: 200<br>RF electric power: 1800 | 350 |
| i type buffer layer | $SiH_4$: 170<br>$H_2$: 1500 | 134.0<br>(1.05 Torr) | RF electric power: 210 | 320 |
| p type layer | $SiH_4$: 30<br>$BF_3H_2$<br>($BF_3$: 2%): 800<br>$H_2$: 3000 | 133.3<br>(1.0 Torr) | RF electric power: 800 | 175 |
| n type layer | $SiH_4$: 100<br>$PH_3/H_2$<br>($PH_3$: 2%): 240<br>$H_2$: 1000 | 133.3<br>(1.0 Torr) | RF electric power: 250 | 250 |
| i type layer (x3) | $SiH_4$: 100<br>$H_2$: 1000 | 1.3<br>(0.01 Torr) | RF electric power: 220 | 200 |
| p type layer | $SiH_4$: 30<br>$BF_3H_2$<br>($BF_3$: 2%): 380<br>$H_2$: 5000 | 133.3<br>(1.0 Torr) | RF electric power: 800 | 175 |
| Transparent electrode | ITO ($In_2O_3$ + $SnO_2$) thin film 70 nm | | | |
| Collector electrode | Alumimium (Al) thin film 2 μm | | | |

In place of the above-described stainless steel belt-like substrate, a bobbin 503 wound with a stainless steel belt-like substrate (SUS430) 502 to which an aluminum thin film (0.2 μm) and a ZnO thin film (1.2 μm) were deposited by a sputtering method as a lower electrode was set in a vacuum container 501 having a substrate feeding mechanism, as in the above-described experiment, the belt-like substrate was passed to a takeup chamber 520 for the belt-like substrate through gas gates 504, an n type semiconductor layer vacuum containers 505, 506 and 507, i type semiconductor layer vacuum containers 508 and 509, second i type semiconductor layer vacuum containers 510 and 511 by the microwave plasma method, i type semiconductor layer vacuum containers 512, 513 and 514 by RF plasma CVD method, i type semiconductor layer containers 515 and 516, and p type semiconductor layer vacuum containers 517, 518 and 519, and tension was adjusted to a degree at which the substrate is free from slack. Pressures in the vacuum containers 505 to 519 were lowered to $1.3×10^{-4}$ Pa ($1×10^{-6}$ Torr) with an exhaust system (not shown).

In order to control a deposited film thickness distribution on the belt-like substrate 502, opening adjusting plates 102 such as those shown in FIG. 1 were disposed in openings of the i type semiconductor layer discharge containers 521 and 522 by the microwave plasma method. The deposition regions 103 were limited accordingly.

As a heat treatment at a film forming time, 1000 sccm of $H_2$ was introduced into each gas gate from the gate gas introducing pipe as gate gas, and the belt-like substrate was heated to 300° C. with the substrate heater.

A raw material gas was introduced into each discharge container from the gas introducing pipe, the belt-like substrate was conveyed at a speed of 1270 mm/min, and electric power was applied to each discharge container from the microwave oscillator and the radio frequency oscillator to cause plasma discharge in film forming regions, thereby forming an nipnipnip type amorphous silicon film on the belt-like substrate.

After feeding one roll amount of the belt-like substrate, supply of all plasma and gases, power supply to all lamp heaters and conveying of the belt-like substrate were stopped. Then, discharge container leaking nitrogen ($N_2$) gas was introduced into each discharge container to return the container to atmospheric pressure, and the belt-like substrate was taken out from a takeup bobbin.

On a formed nipnipnip type amorphous silicon film, ITO($In_2O_3+SnO_2$) was deposited to a thickness of 70 nm as a transparent electrode by vacuum vapor deposition and Al was further deposited to a thickness of 2 $\mu$m as a collector electrode by vacuum vapor deposition, thereby manufacturing a photovoltaic element.

A formed solar cell was evaluated by measuring a spectral sensitivity characteristic, and a photoelectric conversion efficiency $\eta$ for irradiation with a solar simulator having an AM value of 1.5 and an energy density of 100 mW/cm$^2$. In order to evaluate a distribution in the width direction, the spectral sensitivity characteristic and the photoelectric conversion efficiency were measured at five points in a central portion (C) in the width direction of the belt-like substrate and in both ends (F, FC, RC and R). Evaluation results are summarized in Table 5.

TABLE 5

| | Example 1 | | | Comparative Example 1 | | |
|---|---|---|---|---|---|---|
| Position | Relative thickness of deposited film | Relative sensitivity | Relative photoelectric conversion efficiency | Relative thickness of deposited film | Relative sensitivity | Relative photoelectric conversion efficiency |
| F | 1.00 | 1.00 | 1.00 | 1.00 | 1.00 | 1.00 |
| FO | 0.93 | 0.98 | 0.97 | 0.81 | 0.91 | 0.94 |
| C | 0.92 | 0.98 | 0.97 | 0.72 | 0.78 | 0.79 |
| RO | 0.94 | 0.98 | 0.98 | 0.78 | 0.89 | 0.93 |
| R | 0.98 | 0.99 | 0.99 | 0.96 | 0.99 | 0.99 |
| Ununiformity | 3.1% | | | 22.1% | | |

Furthermore, a solar cell having a size of 350 mm by 240 mm was manufactured and an efficiency of the whole solar cell was evaluated. Results are shown in Table 6.

TABLE 6

| | Example 1 | Comparative Example 1 |
|---|---|---|
| Average photoelectric conversion efficiency (effective area 350 × 240) | 10.2% | 9.5% |

As apparent from Table 5 and Table 6, the experiment indicated that the opening adjusting plates suppressed ununiformity of a total deposited film thickness within 10%, thereby suppressing ununiformities of relative sensitivities and photoelectric conversion efficiencies of the solar cells. Furthermore, the experiment indicated that a photoelectric conversion of the whole solar cell could be enhanced by suppressing the ununiformity of the photoelectric conversion efficiency.

Comparative Example 1

Figure 6:
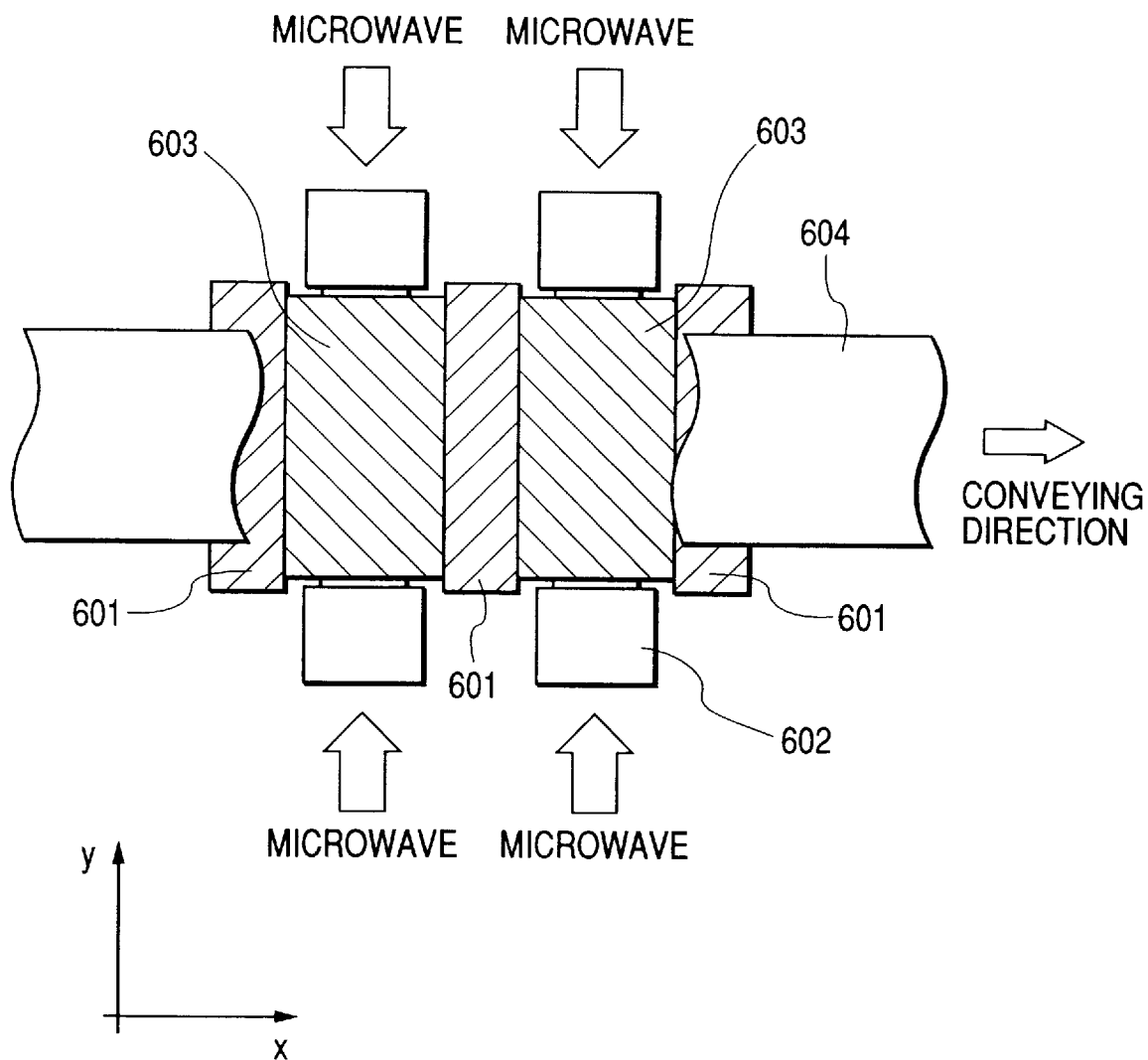
FIG. 6 is a schematic conceptional diagram of an opening adjusting plate used in Comparative Example 1.

In Comparative Example 1, opening adjusting plates 601 shown in FIG. 6 which had an equal opening length in the width direction were used in contrast to Example 1 wherein the opening adjusting plate 102 shown in FIG. 1 were used. Other film forming conditions were the same as those in Example 1. In Comparative Example 1, a solar cell was manufactured in the other film forming conditions shown in Table 1 including the microwave electric power.

A film thickness distribution of an obtained deposited film in the width direction provided results shown in Table 3. It was found that ununiformity of the film thickness distribution of the obtained deposited film was larger than 10%.

Similarly as in Example 1, an nipnipnip type amorphous silicon film was formed on a belt-like substrate. On an n type layer, ITO($In_2O_3+SnO_2$) was deposited to a thickness of 70 nm as a transparent electrode by vacuum vapor deposition and Al was further deposited to a thickness of 2 $\mu$m as a collector electrode by vacuum vapor deposition, thereby manufacturing a photovoltaic element.

A formed solar cell was evaluated by measuring a spectral sensitivity characteristic and a photoelectric conversion efficiency $\eta$ for irradiation with a solar simulator having an AM value of 1.5 and an energy density of 100 mW/cm$^2$.

Evaluation results are summarized in Table 5. Furthermore, a solar cell having a size of 350 mm by 240 mm was manufactured, and an overall efficiency in the width direction of a substrate was evaluated. An evaluation result is shown in Table 6.

Ununiformity of a deposited film thickness was larger than 10% when the opening adjusting plates 601 were used. The ununiformity of the deposited film thickness caused ununiformity of the photoelectric conversion efficiency, thereby resulting in degradation of a photoelectric conversion efficiency of the whole solar cell.

EXAMPLE 2

Figure 7:
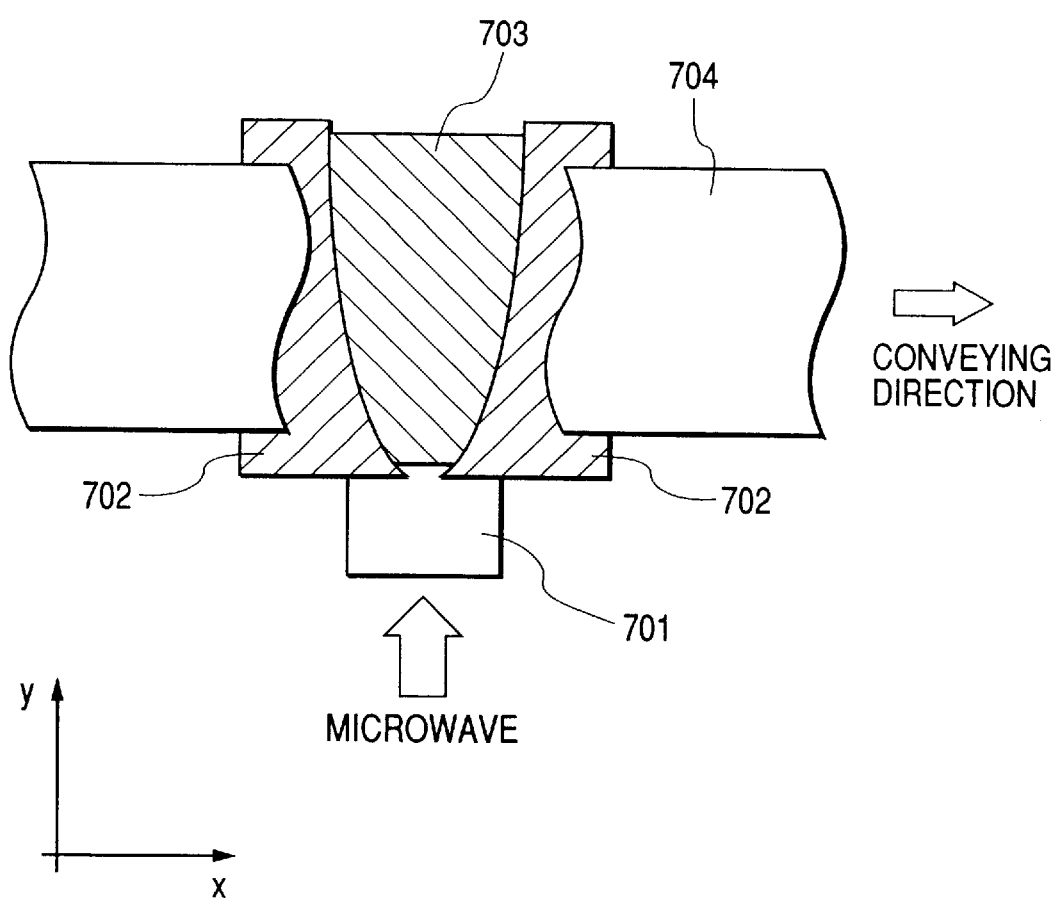
FIG. 7 is a conceptional diagram explaining Example 2 of the present invention in which an opening adjusting plate is disposed in an opening of a discharge container to make uniform a film thickness distribution in a width direction of a belt-like substrate.

In Example 2, an i type layer was formed by using an applicator 701 and introducing microwave electric power as shown in FIG. 7, in contrast to Example 1 wherein the i type layer was formed by using the four applicators 222 and introducing the microwave electric power as shown in FIG. 2. The i type layer was manufactured by setting film forming conditions as shown in Table 1. In FIG. 7, reference numeral 702 denotes an opening adjusting plate, reference numeral 703 denotes a deposition region and reference numeral 704 denotes a belt-like substrate.

After passing the belt-like substrate (SUS 430) through vacuum containers and lowering their pressures to $1.3\times10^{-4}$ Pa ($1\times10^{-6}$ Torr) with an exhaust system (not shown) in the procedures described in Example 1, an i type amorphous silicon film was formed on the substrate by causing discharge. A deposited film was formed over an entire range of openings of discharge containers 207a and 207b without disposing the opening adjusting plates 219 for controlling a deposited film thickness distribution in the openings of the discharge containers 207a and 207b. After confirming stabilization of a discharge condition, a stationary sample was prepared by stopping conveyance of the substrate.

In order to evaluate the distribution in the width direction, deposition rates were measured with a spectroscope at 3 points in a central portion (C) and in both ends (F and R) as shown in FIG. 3 by at 7 points in the conveying direction of the substrate, i.e., at 21 points in total. Results of a deposition rates of an obtained deposited film are shown in Table 7 and FIG. 8.

TABLE 7

| Position | Position (mm) | | | | | | |
|---|---|---|---|---|---|---|---|
| | 5 | 45 | 85 | 125 | 165 | 205 | 245 |
| F | 38.0 | 60.4 | 76.4 | 92.1 | 100.7 | 90.1 | 61.9 |
| C | 43.5 | 60.5 | 73.6 | 88.8 | 97.2 | 87.2 | 61.4 |
| R | 38.0 | 52.9 | 63.4 | 73.4 | 82.6 | 75.2 | 53.4 |

Figure 8:
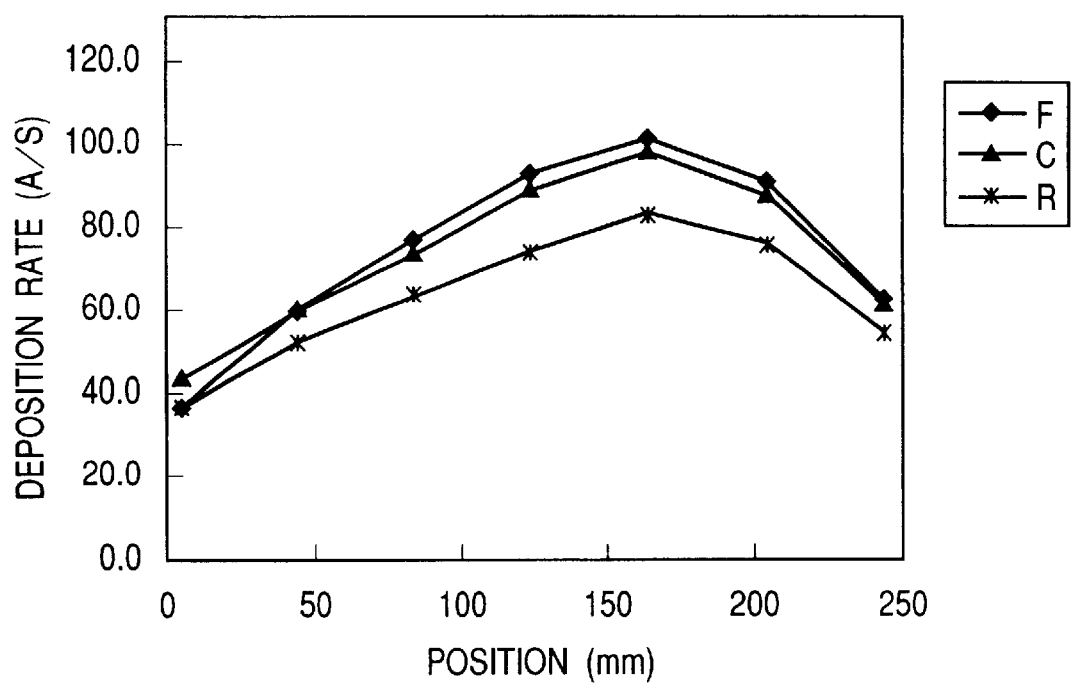
FIG. 8 is a graph showing deposition rate distribution on stationary samples in Example 2.

As understood from Table 7 and FIG. 8, deposition rates of the obtained deposited film were not constant in the width direction of the substrate and the conveying direction, but a total deposited film thickness exhibited a large distribution on the width direction when the film was deposited while conveying the belt-like substrate 210.

On the basis of a measurement of a deposition rate distribution, shapes of opening adjusting plates were determined.

When a distance of a discharge space in the conveying direction is represented by x, a distance of the discharge space in a direction perpendicular to the conveying direction is designated by y, a deposition rates at an optional point (x, y) in the discharge space is denoted by d(x, y), a deposited film thickness at $y_1=60$ (mm), $x_{P1} \leq x_1 \leq x_{Q1}$ in the discharge space is represented by $\delta_1(x, y_1)$, a substrate conveying rate v is 1270 (mm/min), an ideal deposited film thickness $\delta$ is 700 (Å), $$d_1(x, y_1) = d_1(vt, y_1) = -1.2t^2 + 16t + 35 (\because x = vt)$$

$$\delta_n(vt, y_n) = \int_{P_n}^{Q_n} d_n(vt, y_n) dt = \delta \quad (1)$$

and points (t, $y_1$) satisfying the formula (1) are $A_1$ (2.8, 60) and $B_1$ (90, 60)

∴(x, y)=$A_1$ (59, 60), $B_1$ (191, 60)

When a deposited film thickness at $y_2=20$ (mm), $x_{P2} \leq x_2 \leq x_{Q2}$ in the discharge space is represented by $\delta$ (x, $Y_2$), the following was obtained:

$$d_2(x, y_2) = d_2(vt, y_2) = -1.3t^2 + 19t + 29 (\because x = vt)$$

$$\delta_2(vt, y_2) = \int_{P2}^{Q2} d_2(vt, y_2) dt = \delta \quad (1)'$$

and points (t, $y_2$) satisfying the formula (1)' are $A_2$ (0.91, 35) and $B_2$ (10.89, 35)

∴(x, y)=$A_2$ (19, 20), $B_2$ (231, 20)

When a deposited film thickness at $y_3=100$ (mm), $x_{P3} \leq x_3 \leq x_{Q3}$ in the discharge space is denoted by $\delta$ (x, $y_3$), the following was obtained:

$$d_3(x, y_3) = d_3(vt, y_3) = -5.2t^2 + 33t + 35 (\because x = vt)$$

$$\delta_3(vt, y_3) = \int_{P3}^{Q3} d_3(vt, y_3) dt = \delta \quad (1)''$$

points (t, $y_3$) satisfying and the formula (1)" are $A_3$ (0.35, 100) and $B_3$ (11.45, 100)

∴(x, y)=$A_3$ (17, 100), $B_3$ (123, 100)

a quadratic curve passing the points A1, A2 and $A_3$: $x=F_1$ (y)=$2.6 \times 10^{-2} y_2 - 5.2y - 94$ and a quadratic curve passing the points $B_1$, $B_2$ and $B_3$: $x=F_2$ (y)=$-5.9 \times 10^{-4} y_2 + 6.0y + 107$ Shapes of opening adjusting plates were determined from the obtained curves, and an nip type single cell was manufactured while controlling a deposited film thickness distribution on the belt-like substrate 704 using the opening adjusting plates 702 which had distributions in the width direction of the deposition region 703 as shown in FIG. 7. Steps till gas introduction were carried out similarly as in the experiment 1, the belt-like substrate 704 was conveyed at a speed of 1270 mm/min, and microwave electric power and RF electric power were applied to the discharge container from the microwave oscillator 220 and the RF oscillator 227 to cause plasma discharge in a film forming region, thereby forming an nip type amorphous silicon film on the belt-like substrate.

On the formed nip type amorphous silicon film, ITO ($In_2O_3+SnO_2$) was deposited to a thickness of 70 nm as a transparent electrode by vacuum vapor deposition and Al was further deposited to a thickness of 2 μm as a collector electrode by vacuum vapor deposition, thereby manufacturing a photovoltaic element. A film thickness distribution of an i layer was evaluated from a C-V characteristic of the obtained photovoltaic element. The film thickness distribution of the obtained deposited film is shown in Table 8.

TABLE 8

| Position | F | C | R | Ununiformity |
|---|---|---|---|---|
| Example 2 | 1.00 | 0.97 | 0.96 | 3.1% |
| Comparative Example 2 | 1.00 | 0.94 | 0.82 | 19.8% |

It was found in Example 2 that an obtained deposited film thickness was uniform in the width direction and ununiformity of the deposited film thickness was within 10%.

Then, a triple cell was manufactured using a roll to roll type plasma CVD apparatus which was capable of forming an nipnipnip type triple cell such as that shown in FIG. 5. Film forming conditions are shown in Table 4.

A bobbin 503 wound with a belt-like substrate (SUS430) 502 on which an aluminum thin film (0.2 μm) and a ZnO thin film (1.2 μm) were deposited by a sputtering method as a lower electrode was set, in place of the stainless steel belt-like substrate (SUS430), in a vacuum container 501 having a substrate feeding mechanism, the belt-like substrate was passed to a belt-like substrate takeup chamber 520 through gas gates 504, n type semiconductor layer vacuum containers 505, 506 and 507, i type semiconductor layer vacuum containers 508 and 509, i type semiconductor layer vacuum containers 510 and 511 by the microwave plasma method, i type semiconductor layer vacuum containers 512, 513 and 514 by the RF plasma CVD method, i type semiconductor layer vacuum containers 515 and 516, and p type semiconductor layer vacuum containers 517, 518 and 519, and a tension was adjusted to a degree at which the substrate was free from slack as in the above-described experiment. The internal pressures of the vacuum containers 505 through 519 were lowered to $1.3 \times 10^{-4}$ Pa ($1 \times 10^{-6}$ Torr) with an exhaust system (not shown).

Opening adjusting plates 102 such as those shown in FIG. 1 were disposed in openings of i type semiconductor layer discharge containers 521 and 522 by the microwave plasma method to control a deposited film thickness distribution on the belt-like substrate 502. A deposition region 103 was limited accordingly.

As a heat treatment at a film forming time, 1000 sccm of $H_2$ was introduced into each gas gate from a gate gas introducing pipe as a gate gas and the belt-like substrate was heated to 300° C. with a substrate heater.

A raw material gas was introduced into each discharge container from the gas introducing pipe, the belt-like substrate was conveyed at a speed of 1270 mm/min, and electric power was applied to each discharge container from a microwave oscillator and a radio frequency oscillator to cause plasma discharge in a film forming region, thereby forming an nipnipnip type amorphous silicon film on the belt-like substrate.

After feeding one roll amount of the belt-like substrate, all plasma, supply of all gases, power supply to all lamp heaters and conveyance of the substrate were stopped. Then, discharge container leaking nitrogen ($N_2$) gas was introduced into the discharge containers to return the discharge containers to atmospheric pressure and the belt-like substrate was taken from a takeup bobbin.

On the formed nipnipnip type amorphous silicon film, ITO($In_2O_3+SnO_2$) was deposited to a thickness of 70 nm as a transparent electrode by vacuum vapor deposition and Al was further deposited to a thickness of 2 $\mu$m as a collector electrode by vacuum vapor deposition, thereby manufacturing a photovoltaic element.

A formed solar cell was evaluated by measuring a spectral sensitivity characteristic and a photoelectric conversion efficiency $\eta$ for irradiation with a solar simulator having an AM value of 1.5 and an energy density of 100 W/cm$^2$.

In order to evaluate the distribution in the width direction, the spectral sensitivity characteristic and the photoelectric conversion efficiency were measured at three points of a central portion (C) in the width direction and both ends (F and R) of the belt-like substrate. Evaluation results are shown in Table 9.

TABLE 9

|  | Example 2 | | | Comparative Example 2 | | |
| --- | --- | --- | --- | --- | --- | --- |
| Position | Relative thickness of deposited film | Relative sensitivity | Relative photoelectric conversion efficiency | Relative thickness of deposited film | Relative sensitivity | Relative photoelectric conversion efficiency |
| F | 1.00 | 1.00 | 1.00 | 1.00 | 1.00 | 1.00 |
| C | 0.97 | 0.98 | 0.98 | 0.94 | 0.94 | 0.95 |
| R | 0.96 | 0.97 | 0.99 | 0.83 | 0.82 | 0.81 |
| Ununiformity | 3.1% | | | 22.1% | | |

Furthermore, a solar cell having a size of 350 mm×240 mm was manufactured and an efficiency of the whole solar cell was evaluated. An evaluation result is shown in Table 10.

TABLE 10

|  | Example 2 | Comparative Example 2 |
| --- | --- | --- |
| Average photoelectric conversion efficiency (effective area 350 × 240) | 10.2% | 9.1% |

As apparent from Table 9 and Table 10, it has been found that the opening adjusting plates suppressed ununiformity of a total deposited film thickness within 5%, thereby suppressing a relative sensitivity and a photoelectric conversion efficiency of a solar cell. Furthermore, the suppression of ununiformity of the photoelectric conversion efficiency makes it possible to enhance a photoelectric conversion efficiency of the whole solar cell.

Comparative Example 2

Figure 9:
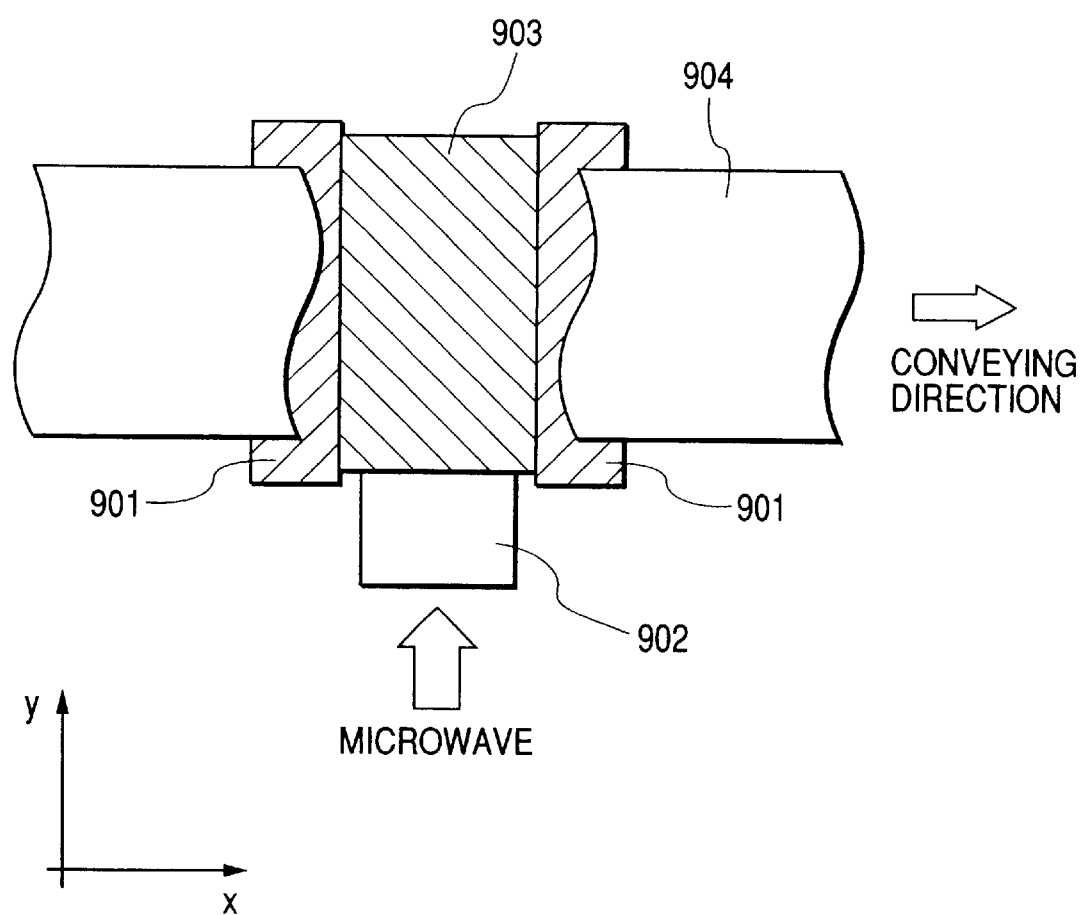
FIG. 9 is a schematic conceptional diagram of an opening adjusting plate in Comparative Example 2.

Opening adjusting plates 901 which had an equal opening length in the width direction shown in FIG. 9 were used in Comparative Example 2, in contrast to Example 2 in which the opening adjusting plates 702 shown in FIG. 7 were used. Other film forming conditions were the same as those in Example 2. In Comparative Example 2, a photovoltaic element was manufactured by setting microwave electric power and other film forming conditions as shown in Table 1. In FIG. 9, reference numeral 902 denotes an applicator, reference numeral 903 denotes a deposition region and reference numeral 904 denotes a belt-like substrate.

A thickness distribution in a width direction of an obtained deposited film is shown in Table 8. It was found that the thickness distribution of the obtained deposited film was larger than 10%.

Similarly as in Example 2, an nipnipnip type amorphous silicon film was formed on the belt-like substrate. On an n type layer, ITO($In_2O_3+SnO_2$) was deposited to a thickness of 70 nm as a transparent electrode by vacuum vapor deposition and Al was further deposited to a thickness of 2 $\mu$m as a collector electrode by vacuum vapor deposition, thereby manufacturing a photovoltaic element.

A formed solar cell was evaluated by measuring a spectral sensitivity characteristic and a photoelectric conversion efficiency $\eta$ for irradiation with a solar simulator having an AM value of 1.5 and an energy density of 100 mW/cm$^2$.

Evaluation results are summarized in Table 9. Furthermore, a solar cell having a size of 350 mm×240 mm was manufactured and an efficiency in the width direction of the whole solar cell was evaluated. An evaluation result is shown in Table 10.

When the opening adjusting plates 901 were used, ununiformity of the deposited film thickness was larger than 10%. The ununiformity of the deposited film thickness caused ununiformity of a photoelectric conversion efficiency, thereby resulting in degradation of the solar cell as a whole.

EXAMPLE 3

Figure 10:
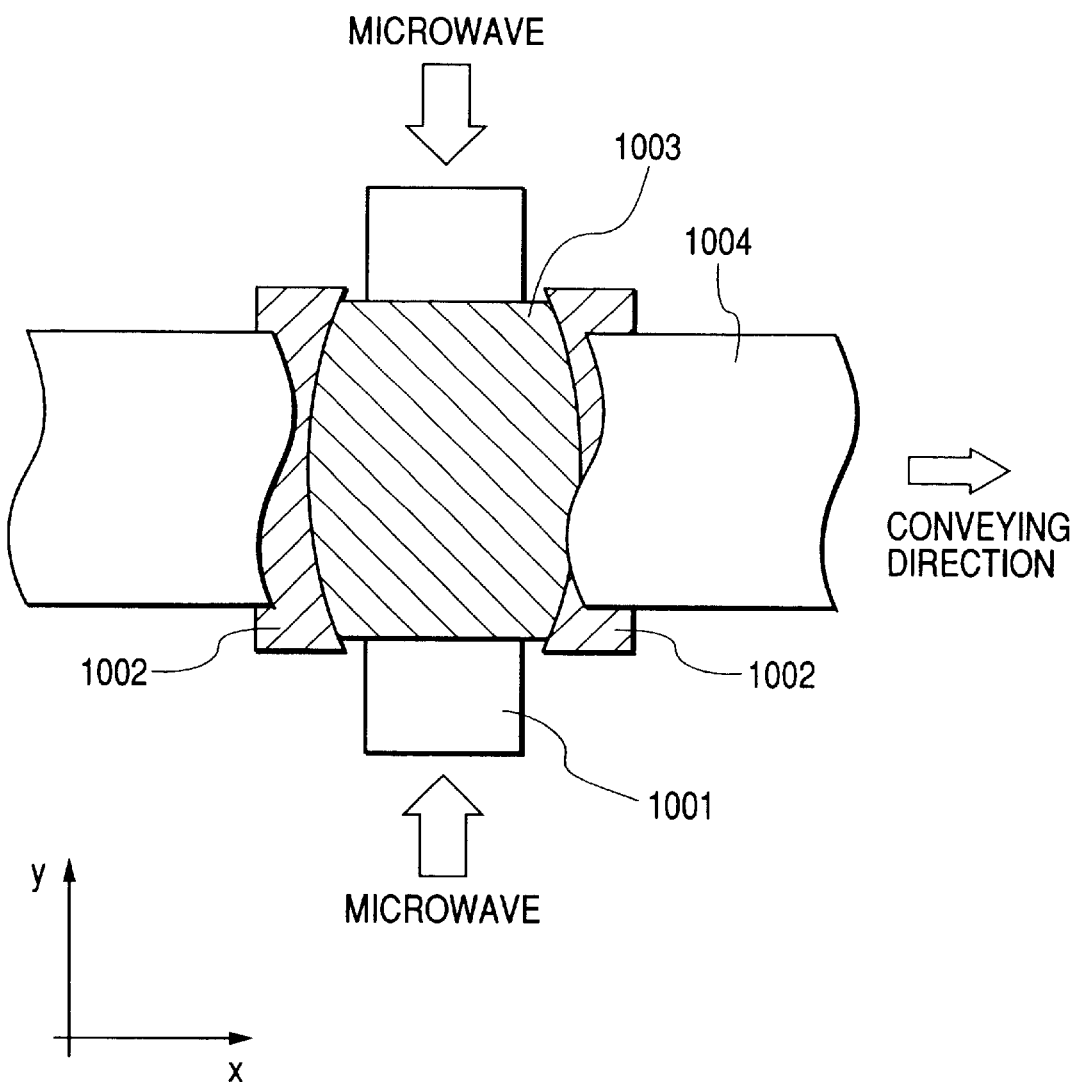
FIG. 10 is a conceptional diagram explaining Example 3 of the present invention in which an opening adjusting plate is disposed in an opening of a discharge container to make uniform a film thickness distribution in a width direction of a belt-like substrate.

In Example 3, an i type layer was formed by using two applicators 1001 and introducing microwave electric power as shown in FIG. 10, in contrast to Example 1 where the i type layer was formed by using the four applicators and introducing the microwave electric power as shown in FIG. 2. The i type layer was formed by setting film forming conditions as shown in Table 1. In FIG. 10, reference numeral 1002 denotes opening adjusting plates, reference numeral 1003 denotes a deposition region and reference numeral 1004 denotes a belt-like substrate.

A stainless steel substrate (SUS430) was passed through vacuum containers in the sequence described with reference to Example 1, their pressures were lowered to 1.3×10$^{-4}$ Pa (1×10$^{-6}$ Torr) with an exhaust system (not shown) and discharge was caused, thereby forming an i type amorphous silicon film on the belt-like substrate. A deposited film was formed in an entire range of openings of discharge containers 207a and 207b without disposing the opening adjusting plates 219 for controlling a deposited film thickness distribution in the discharge containers. After confirming stabilization of a discharge condition, a stationary sample was prepared by stopping conveyance of the substrate.

In order to evaluate a distribution in the width direction, deposition rates were measured at three points in a central portion (C) and both ends (F and R) by five points in a substrate conveying direction, i.e., at 15 points in total as shown in FIG. 3. Results of deposition rates of the obtained deposited film are shown in Table 11 and FIG. 11.

TABLE 11

| | Position (mm) | | | | |
|---|---|---|---|---|---|
| Position | 20 | 68 | 117 | 166 | 214 |
| F | 47.7 | 68.7 | 82.7 | 75.2 | 53.8 |
| C | 48.7 | 61.2 | 69.8 | 64.6 | 50.1 |
| R | 56.3 | 75.2 | 85.6 | 79.0 | 55.8 |

Figure 11:
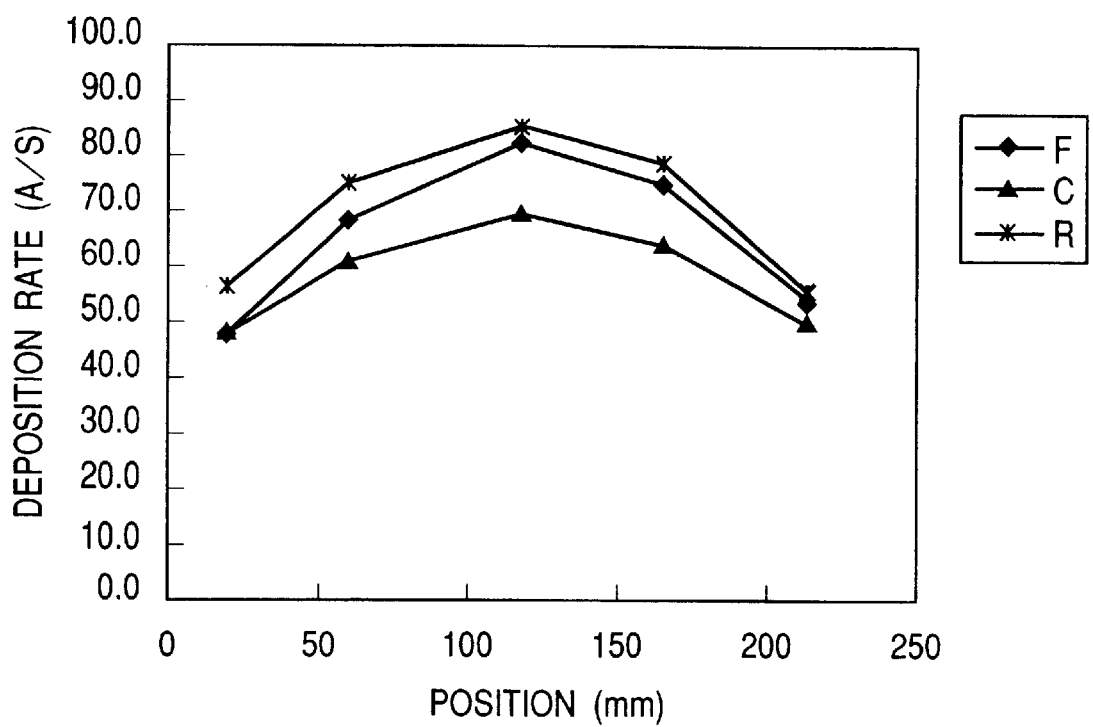
FIG. 11 is a graph showing deposition rate distribution on stationary samples in Example 3 of the present invention.

As seen from Table 11 and FIG. 11, the deposition rates of the obtained deposited film were not constant in the width direction and the conveying direction of the substrate, and a total deposited film thickness was largely distributed when the film was deposited while conveying the belt-like substrate 210.

On the basis of the measurement of the deposition rate distribution, shapes of the opening adjusting plates were determined.

When a distance of a discharge space in the conveying direction was represented by x, a distance of the discharge space in a direction perpendicular to the conveying direction was designated by y, a deposition rate at an optional point (x, y) was denoted by d(x, y), a deposited film thickness at $y_1=175$ (mm), $x_{P1} \leq x_1 \leq x_{Q1}$ was represented by $\delta_1(x, y_1)$, a substrate conveying speed v is 1270 (mm/min), an ideal deposited film thickness $\delta$ was 600 (Å), $$d_1(x, y_1) = d_1(vt, y_1) = -0.93t^2 + 10.5t + 38.9 (\because x = vt)$$

$$\delta_n(vt, y_n) = \int_{P_n}^{Q_n} d_n(vt, y_n) dt = \delta \quad (1)$$

points $(t, y_1)$ satisfying the formula (1) are $A_1$ (0.43, 175) and $B_1$ (10.87, 175)

$\therefore (x, y) = A_1$ (9, 175), $B_1$ (231, 175)

When a deposited film thickness at $y_2=35$ mm, $x_{P2} \leq x_2 \leq x_{Q2}$ in the discharge space is represented by $\delta(x, y_2)$, the following was obtained:

$$d_2(x, y_2) = d_2(vt, y_2) = -1.45t^2 + 16.9t + 32.1 (\because x = vt)$$

$$\delta_2(vt, y_2) = \int_{P2}^{Q2} d_2(vt, y_2) dt = \delta \quad (1)'$$

and points $(t, y_2)$ satisfying the formula (1)' are $A_2$ (0.80, 35) are $B_2$ (10.5, 35)

$\therefore (x, y) = A_2$ (17, 35), $B_2$ (223, 35)

When a deposited film thickness at $y_3=315$ (mm), $x_{P3} \leq x_3 \leq x_{Q3}$ in the discharge space is designated by $\delta(x, y_3)$, the following was obtained:

$$d_3(x, y_3) = d_3(vt, y_3) = -5.2t^2 + 33t + 35 (\because x = vt)$$

$$\delta_3(vt, y_3) = \int_{P3}^{Q3} d_3(vt, y_3) dt = \delta \quad (1)''$$

points $(t, y_3)$ satisfying the formula (1)" are $A_3$ (1.05, 315) and $B_3$ (10.25, 315)

$\therefore (x, y) = A_3$ (23, 315), $B_3$ (217, 315)

a quadratic curve passing the points $A_1, A_2$ and $A_3$: $x = F_1$ (y) = $5.6 \times 10^{-4} y^2 - 0.17 y + 22$ and a quadratic curve passing the points $B_1, B_2$ and $B_3$: $x = F_2$ (y) = $-5.6 \times 10^{-4} y^2 + 0.17 y + 218$ Shapes of the opening adjusting plates were determined from the obtained curves, and an nip type single cell was manufactured while controlling a deposited film thickness distribution on the belt-like substrate 1004 using the opening adjusting plates 1002 which had distributions in a width direction of the deposition region 1003 as shown in FIG. 10. Steps till gas introduction were carried out similarly as in the experiment 1, the belt-like substrate 1004 was conveyed at a speed of 1270 mm/min, and microwave electric power and RF electric power were applied to discharge containers from the microwave oscillator 220 and the RF oscillator 227 to cause plasma discharge, thereby forming a nip type amorphous silicon film on the belt-like substrate.

On the formed nip type silicon film, ITO ($In_2O_3 + SnO_2$) was deposited to a thickness of 70 nm as a transparent electrode by vacuum vapor deposition and Al was further deposited to a thickness of 2 $\mu$m as a collector electrode by vacuum vapor deposition, thereby manufacturing a photovoltaic element. The thickness distribution of an i type layer was evaluated from C-V characteristics of the obtained photovoltaic element. A thickness distribution of a deposited film is shown in Table 12.

TABLE 12

| Position | F | C | R | Ununiformity |
|---|---|---|---|---|
| Example 3 | 1.00 | 0.96 | 0.98 | 3.1% |
| Comparative Example 3 | 1.00 | 0.80 | 1.00 | 21.8% |

It was found that the obtained deposited film thickness was uniform in the width direction and the ununiformity was suppressed within 10%.

Then, a triple cell was manufactured using the roll to roll type plasma CVD apparatus shown in FIG. 5 which was capable of forming a nipnipnip type triple cell. Film forming conditions are shown in Table 4.

In place of the stainless steel belt-like substrate (SUS430), a bobbin 503 wound with a stainless steel belt-like substrate (SUS430) 502 on which an aluminum thin film (0.2 $\mu$m) and a ZnO thin film (1.2 $\mu$m) were formed by the sputtering method as a lower electrode was set in a vacuum container 501 having a substrate feeding mechanism, the belt-like substrate was passed to the belt-like substrate takeup chamber 520 through the gas gates 504, the n type semiconductor layer vacuum containers 505, 506 and 507, the i type semiconductor layer vacuum containers 508 and 509, the i type semiconductor layer containers 510 and 511 by the microwave plasma method, the i type semiconductor layer vacuum chambers 512, 513 and 514 by the RF plasma method, the i type semiconductor layer vacuum containers 515 and 516, and the p type semiconductor layer vacuum containers 517, 518 and 519 similarly as in the above-described experiment, and a tension was adjusted to a degree at which the belt-like substrate was free from slack. Pressure in each of the vacuum containers was lowered to $1.3 \times 10^{-4}$ Pa ($1 \times 10^{-6}$ Torr) with an exhaust system (not shown).

The opening adjusting plates 102 were disposed in the openings of the i type semiconductor layer discharge containers 521 and 522 using the microwave plasma method as shown in FIG. 1 in order to control a deposited film thickness distribution on the belt-like substrate 502. A deposition region 103 was limited accordingly.

As a heat treatment at a film forming time, 1000 sccm of $H_2$ was introduced into each gas gate from the gate gas introducing pipe and the belt-like substrate was heated to 300° C. with the substrate heater.

A raw material gas was introduced into each discharge container from the gas introducing pipe, the belt-like substrate was conveyed at a speed of 1270 mm/min and electric power was applied to each discharge container from the microwave oscillator and the radio frequency oscillator to cause plasma discharge in a film forming region, thereby forming a nipnipnip type amorphous silicon film on the belt-like substrate.

After conveying one roll amount of the belt-like substrate, all plasma, supply of all gases, power supply to all lamp heaters and conveyance of the substrate were stopped. Then, a discharge container leaking nitrogen ($N_2$) gas was introduced into the discharge containers to return the containers at atmospheric pressure, and the belt-like substrate was taken from the takeup bobbin.

On the formed nipnipnip type amorphous silicon film, ITO ($In_2O_3+SnO_2$) was deposited to a thickness of 70 nm as a transparent electrode by vacuum vapor deposition and Al was further deposited as a collector electrode to a thickness of 2 μm by vacuum vapor deposition, thereby manufacturing a photovoltaic element.

The formed solar cell was evaluated by measuring a spectral sensitivity characteristic and a photoelectric conversion efficiency η for irradiation with a solar simulator having an AM value of 1.5 and an energy density of 100 mW/cm$^2$. In order to evaluate a distribution in the width direction, the spectral sensitivity characteristic and the photoelectric conversion efficiency were measured at three points of a central portion (C) and both ends (F and R). Measured results are summarized in Table 13.

TABLE 13

| | Example 3 | | | Comparative Example 3 | | |
|---|---|---|---|---|---|---|
| Position | Relative thickness of deposited film | Relative sensitivity | Relative photoelectric conversion efficiency | Relative thickness of deposited film | Relative sensitivity | Relative photoelectric conversion efficiency |
| F | 1.00 | 1.00 | 1.00 | 1.00 | 1.00 | 1.00 |
| C | 0.96 | 0.96 | 0.98 | 0.76 | 0.81 | 0.87 |
| R | 0.98 | 0.99 | 0.99 | 0.99 | 0.99 | 1.01 |
| Ununi-formity | 4.1% | | | 22.1% | | |

Furthermore, a solar cell having a size of 350 mm×240 mm was manufactured and an efficiency of the whole solar cell was evaluated. An evaluation result is shown in Table 14.

TABLE 14

| | Example 3 | Comparative Example 3 |
|---|---|---|
| Average photoelectric conversion efficiency (effective area 350 × 240) | 10.2% | 9.2% |

As apparent from Table 13 and Table 14, it was found that the opening adjusting plates suppressed ununiformity of the deposited film thickness within 10%, thereby suppressing ununiformities of the relative sensitivity and the photoelectric conversion efficiency. Furthermore, it was found that a photoelectric conversion efficiency of the whole solar cell could be enhanced by suppressing the ununiformity of the photoelectric conversion efficiency.

Comparative Example 3

Figure 12:
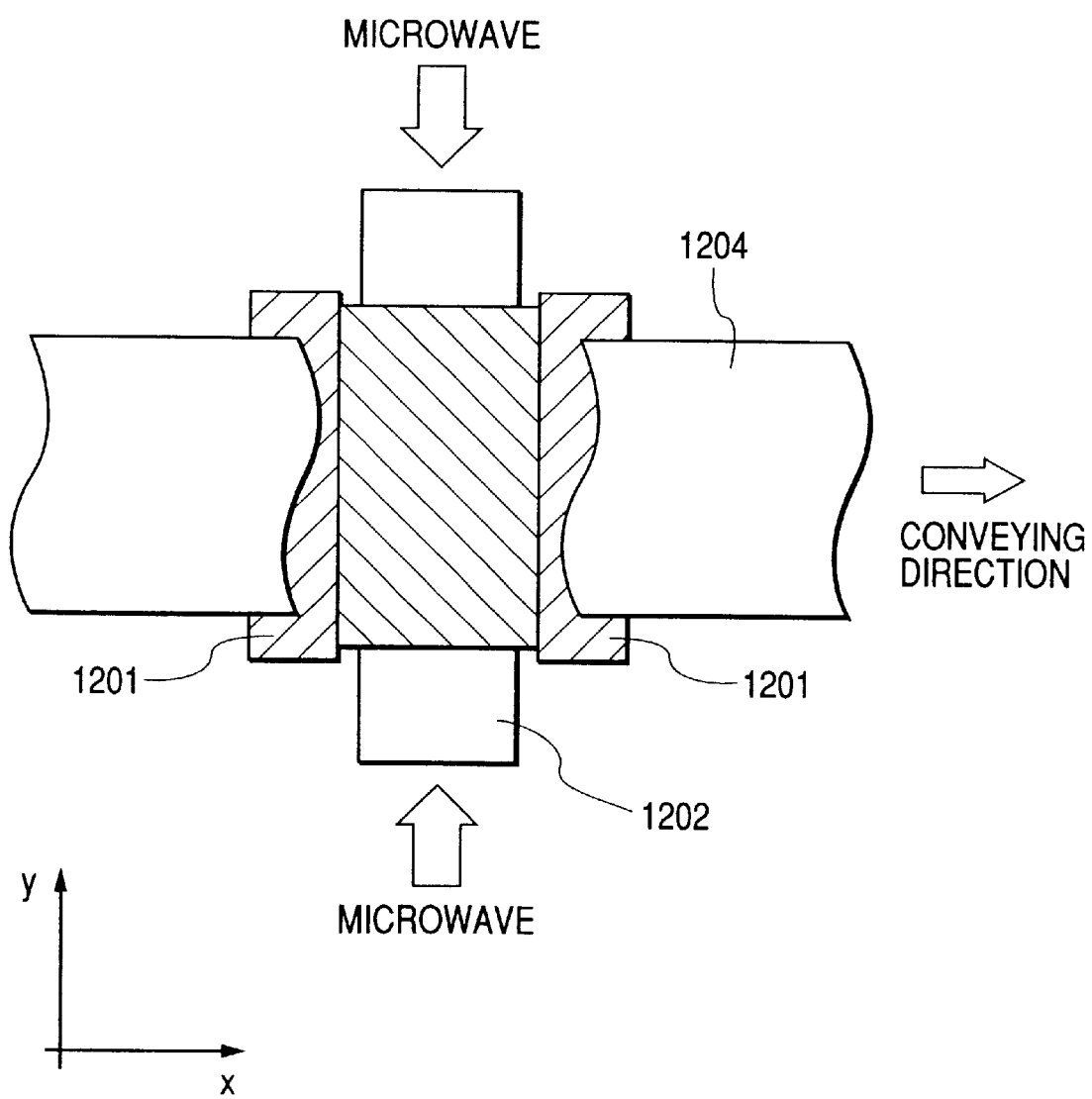
FIG. 12 is a schematic conceptional diagram showing an opening adjusting plate in Comparative Example 3.

In Comparative Example 3, opening adjusting plates 1201 which had an equal opening length in the width direction shown in FIG. 12 were used in contract to the opening adjusting plate 1002 shown in FIG. 10 which were used in Example 3. Other film forming conditions were the same as those in Example 3. In Comparative Example 3, a photovoltaic element was manufactured using the microwave electric power and other film forming conditions shown in Table 1. In FIG. 12, reference numeral 1202 denotes an applicator, reference numeral 1203 denotes a deposition region and reference numeral 1204 denotes a belt-like substrate.

The obtained deposited film had a film thickness distribution in the width direction which is shown in Table 12. It was found that ununiformity of the film thickness distribution of the obtained deposited film was larger than 10%.

Similarly as in Example 3, a nipnipnip type amorphous silicon film was formed on the belt-like substrate. On an n type layer, ITO ($In_2O_3+SnO_2$) was deposited to a thickness of 70 nm as a transparent electrode by vacuum vapor deposition and Al was further deposited to a thickness of 2 μm as a collector electrode by vacuum vapor deposition, thereby manufacturing a photovoltaic element.

The formed solar cell was evaluated by measuring a spectral sensitivity characteristic and a photoelectric conversion efficiency η for irradiation with a solar simulator having an AM value of 1.5 and an energy density of 100 mW/cm$^2$. Evaluation results are shown in Table 13.

Furthermore, a solar cell having a size of 350 mm×240 mm was manufactured for evaluating an efficiency of the whole solar cell in the width direction. A result is shown in Table 14.

Ununiformity of a deposited film thickness was larger than 10% when the above-described opening adjusting plates 1201 were used. The ununiformity of the deposited film caused ununiformity of the photoelectric conversion efficiency, thereby resulting in decrease of the photoelectric conversion efficiency of the whole solar cell.

As described above, the deposited film forming method and the deposited film forming apparatus according to the present invention are configured to dispose the opening adjusting plates in the openings of the discharge containers so as to partially shield the belt-like substrate from the discharge region, thereby making it possible to improve a film thickness distribution of the deposited film in the width direction and make uniform various characteristics of the deposited film. As a result, the deposited film forming method and the deposited film forming apparatus according to the present invention make it possible to provide a photovoltaic element having a large area with high uniformity and excellent characteristics as well as devices which use the photovoltaic element.

What is claimed is:

1. A method for forming a deposited film, comprising generating plasma in a plurality of successive vacuum containers and continuously forming a deposited film on a belt-like substrate while continuously moving the substrate in a longitudinal direction of the substrate, wherein the film is formed while an opening of a discharge container is adjusted by using an opening adjusting plate having a shape which is set so as to reduce ununiformity of a deposited film thickness in a width direction of the substrate on basis of a measurement of a deposition rate distribution by shielding the belt-like substrate from a plasma discharge region to limit a deposition region on the belt-like substrate.

2. The method for forming a deposited film according to claim 1, wherein both ends of the opening of the discharge container are set so as to have a curve satisfying the following formula (2) and a curve satisfying the following formula (3), respectively, to adjust the opening of the discharge container, and wherein when a distance of a discharge space in a conveying direction is represented by $x_n$, a distance of the discharge space in a direction perpendicular to the conveying direction is represented by $y_n$, a deposition rate at an optional point $(x_n, y_n)$ in the discharge space is represented by $d(x_n, y_n)$, a deposited film thickness at y=yn, $x_{Pn} \leq x_n \leq x_{Qn}$ in the discharge space is represented by $\delta_n(x, y_n)$, and n=3, 4, 5, 6, ..., and when a substrate conveying rate is represented by v and an ideal thickness of the deposited film is represented by, $$d_n(x, y_n) = d_n(vt, y_n) = a_n t^2 + b_n t + c_n (\because x=vt)$$

$$\delta_n(vt, y_n) = \int_{Pn}^{Qn} d_n(vt, y_n) dt = \delta \quad (1)$$

and, a point $A_n(vP_n, y_n)$ and a point $B_n(vQ_n, y_n)$ which satisfy the formula (1) are obtained, and a quadratic curve passing the point $A_n$ is $$x=F_1(y) \quad (2)$$

and a quadratic curve passing the point Bn is $$x=F_2(y). \quad (3)$$

3. The method for forming a deposited film according to claim 2, wherein a shape of the opening adjusting plate is set so that both ends of the opening of the discharge container have an arc passing the point $A_n$ and an arc passing the point $B_n$ determined from a deposition rate distribution in a width direction of the belt-like substrate and the deposition region of the belt-like substrate is limited by adjusting the opening of the discharge container with the opening adjusting plate.

4. The method for forming a deposited film according to claim 1, wherein a shape of the opening adjusting plate is set so as to be within ±10% of an opening shape determined from a deposition rate distribution in a width direction of the belt-like substrate.

5. The method for forming a deposited film according to claim 1, wherein the deposited film is formed by microwave plasma CVD.

6. The method for forming a deposited film according to claim 1, wherein a shape of the opening adjusting plate is set so that ununiformity of thickness distribution of the deposited film in a width direction of the belt-like substrate is within 10%.

7. The method for forming a deposited film according to claim 1, wherein the belt-like substrate is continuously moved from a roll-like wound substrate through a plurality of discharge containers by a roll-to-roll system.

8. An apparatus for forming a deposited film in which plasma is generated in a plurality of successive vacuum containers and a deposited film is continuously formed on a belt-like substrate while continuously moving the substrate in a longitudinal direction of the substrate, wherein an opening adjusting plate having a shape set so as to reduce ununiformity of a deposited film thickness in a width direction of the substrate on basis of a measurement of a deposition rate distribution is disposed in an opening of a discharge container to shield the belt-like substrate from a plasma discharge region and limit a deposition region on the belt-like substrate.

9. The apparatus for forming a deposited film according to claim 8, wherein both ends of the opening of the discharge container are set so as to have a curve satisfying the following formula (2) and a curve satisfying the following formula (3), respectively, to adjust the opening of the discharge container, and wherein when a distance of a discharge space in a conveying direction is represented by $x_n$, a distance of the discharge space in a direction perpendicular to the conveying direction is represented by $y_n$, a deposition rate at an optional point $(x_n, y_n)$ in the discharge space is represented by $d(x_n, y_n)$, a deposited film thickness at $y=y_n$, $x_{Pn} \leq X_n \leq x_{Qn}$ in the discharge space is represented by $\delta_n(x, y_n)$, and n=3, 4, 5, 6, ..., and when a substrate conveying rate is represented by v and an ideal thickness of the deposited film is represented by, $$d_n(x, y_n) = d_n(vt, y_n) = a_n t^2 + b_n t + c_n (\because x=vt)$$

$$\delta_n(vt, y_n) = \int_{Pn}^{Qn} d_n(vt, y_n) dt = \delta \quad (1)$$

and, a point $A_n(vP_n, y_n)$ and a point $B_n(vQ_n, y_n)$ which satisfy the formula (1) are obtained, and a quadratic curve passing the point $A_n$ is $$x=F_1(y) \quad (2)$$

and a quadratic curve passing the point Bn is $$x=F_2(y). \quad (3)$$

10. The apparatus for forming a deposited film according to claim 9, wherein a shape of the opening adjusting plate is set so that both ends of the opening of the discharge container have an arc passing through the point $A_n$ and an arc passing the point $B_n$ which are determined from a deposition rate distribution in a width direction of the belt-like substrate, respectively, and the opening adjusting plate for limiting a deposition region of the belt-like substrate is disposed in the opening of the discharge container.

11. The apparatus for forming a deposited film according to claim 8, wherein the opening adjusting plate has a shape within ±10% of a shape of an opening adjusting plate which is determined from a deposition rate distribution in the width direction of the belt-like substrate.

12. The apparatus for forming a deposited film according to claim 8, wherein the deposited film is formed by microwave plasma CVD.

13. The apparatus for forming a deposited film according to claim 8, wherein the opening adjusting plate has a shape which limits ununiformity of thickness of the deposited film in the width direction of the belt-like substrate within 10%.

14. The apparatus for forming a deposited film according to claim 8, wherein the belt-like substrate is continuously moved from a roll-like wound substrate through a plurality of discharge containers by a roll-to-roll system.

15. A method for forming a deposited film, comprising generating plasma in a plurality of successive vacuum containers and continuously forming a deposited film on a belt-like substrate while continuously moving the substrate in a longitudinal direction of the substrate, wherein both ends of the opening of the discharge container are set so as to have a curve satisfying the following formula (4) and a curve satisfying the following formula (5), respectively, to adjust the opening of the discharge container, thereby limiting a deposition region of the belt-like structure, and wherein when a distance of a discharge space in a conveying direction is represented by $x_n$, a distance of the discharge space in a direction perpendicular to the conveying direction is represented by $y_n$, a deposition rate at an optional point $(x_n, y_n)$ in the discharge space is represented by $d(x_n, y_n)$, a deposited film thickness at $y=y_n$, $x_{Pn} \leq x_n \leq x_{Qn}$ in the discharge space is represented by $\delta_n(x, y_n)$, and $n=3, 4, 5, 6, \ldots$, and when a substrate conveying rate is represented by v and an ideal thickness of the deposited film is represented by, $$d_n(x, y_n) = d_n(vt, y_n) = a_n t^2 + b_n t + c_n \ (\because x=vt)$$

$$\delta_n(vt, y_n) = \int_{Pn}^{Qn} d_n(vt, y_n) dt = \delta \quad (1)$$

a point $A_n$ $(vP_n, y_n)$ and a point $B_n$ $(vQ_n, y_n)$ which satisfy the formula (1) are obtained, and a quadratic curve passing the point $A_n$ is $x=F_1(y) \ldots (2)$, and a quadratic curve passing the point $B_n$ is $x=F_2(y) \ldots (3)$, and on basis of the formulas (2) and (3), the following inequality formulas (4) and (5), respectively:

$$1.1F_1(y) - 0.1F_2(y) \leq x \leq 0.9F_1(y) + 0.1F_2(y) \quad (4)$$

$$0.9F_2(y) + 0.1F_1(y) \leq x \leq 1.1F_2(y) - 0.1F_1(y) \quad (5).$$

16. An apparatus for forming a deposited film, which comprises generating plasma in a plurality of successive vacuum containers and continuously forming a deposited film on a belt-like substrate while continuously moving the substrate in a longitudinal direction of the substrate, wherein both ends of the opening of the discharge container are set so as to have a curve satisfying the following formula (4) and a curve satisfying the following formula (5), respectively, to adjust the opening of the discharge container, thereby limiting a deposition region of the belt-like structure, and wherein when a distance of a discharge space in a conveying direction is represented by $x_n$, a distance of the discharge space in a direction perpendicular to the conveying direction is represented by $y_n$, a deposition rate at an optional point $(x_n, y_n)$ in the discharge space is represented by $d(x_n, y_n)$, a deposited film thickness at $y=y_n$, $x_{Pn} \leq x_n \leq x_{Qn}$ in the discharge space is represented by $\delta_n(x, y_n)$, and $n=3, 4, 5, 6, \ldots$, and when a substrate conveying rate is represented by v and an ideal thickness of the deposited film is represented by, $$d_n(x, y_n) = d_n(vt, y_n) = a_n t^2 + b_n t + c_n \ (\because x=vt)$$

$$\delta_n(vt, y_n) = \int_{Pn}^{Qn} d_n(vt, y_n) dt = \delta \quad (1)$$

a point $A_n$ $(vP_n, y_n)$ and a point $B_n$ $(vQ_n, y_n)$ which satisfy the formula (1) are obtained, and a quadratic curve passing the point $A_n$ is $x=F_1(y) \ldots (2)$, and a quadratic curve passing the point $B_n$ is $x=F_2(y) \ldots (3)$, and on basis of the formulas (2) and (3), the following inequality formulas are obtained, respectively:

$$1.1F_1(y) - 0.1F_2(y) \leq x \leq 0.9F_1(y) + 0.1F_2(y) \quad (4)$$

$$0.9F_2(y) + 0.1F_1(y) \leq x \leq 1.1F_2(y) - 0.1F_1(y) \quad (5).$$

* * * * *

UNITED STATES PATENT AND TRADEMARK OFFICE
CERTIFICATE OF CORRECTION

PATENT NO. : 6,667,240 B2
DATED : December 23, 2004
INVENTOR(S) : Hiroyuki Ozaki et al.

It is certified that error appears in the above-identified patent and that said Letters Patent is hereby corrected as shown below:

Column 10,
Line 8, "134.0" should read -- 134.0
                                 (1.05 Torr) --;
Line 9, "(1.05 Torr) power: 210" should read -- power: 210 --; and
Line 11, "$BF_3H_2$" should read -- $BF_3/H_2$ --.

Column 13,
Line 49, "($PH_3$" should read -- ($PH_2$ --;
Line 57, "134.0" should read -- 134.0
                                 (1.05 Torr) --;
Line 58, "(1.05 Torr) power: 210" should read -- power: 210 --; and
Line 59, "$BF_3H_2$" should read -- $BF_3/H_2$ --.

Column 14,
Line 3, "$S_iH_4$:60" should read -- $S_jH_4L$ 170 --;
Line 9, "134.0" should read -- 134.0
                                 (1.05 Torr) --;
Line 10, "(1.05 Torr) power: 210" should read -- power: 210 --;
Lines 12 and 21, "$BF_3H_2$" should read -- $BF_3/H_2$ --.

Column 17,
Line 67, "$10^{-4}y_2$" should read -- $10^{-4}y^2$ --.

Signed and Sealed this

Thirty-first Day of August, 2004

JON W. DUDAS
*Director of the United States Patent and Trademark Office*